United States Patent
Habets et al.

(10) Patent No.: US 11,578,215 B2
(45) Date of Patent: Feb. 14, 2023

(54) COATING AND COATING FORMULATION

(71) Applicant: Covestro (Netherlands) B.V., Nieuwegein (NL)

(72) Inventors: Roberto Arnoldus Dominicus Maria Habets, Echt (NL); Camille Charline Marie-Cécile Carcouet, Echt (NL); Damien Reardon, Echt (NL)

(73) Assignee: Covestro (Netherlands) B.V., Nieuwegein (NL)

( * ) Notice: Subject to any disclaimer, the term of this patent is extended or adjusted under 35 U.S.C. 154(b) by 137 days.

(21) Appl. No.: 16/604,327

(22) PCT Filed: Apr. 17, 2018

(86) PCT No.: PCT/EP2018/059744
§ 371 (c)(1),
(2) Date: Oct. 10, 2019

(87) PCT Pub. No.: WO2018/192908
PCT Pub. Date: Oct. 25, 2018

(65) Prior Publication Data
US 2020/0123391 A1  Apr. 23, 2020

(30) Foreign Application Priority Data

Apr. 18, 2017 (EP) .................. 17166912
Jul. 11, 2017 (EP) .................. 17180733
Sep. 21, 2017 (EP) .................. 17192491

(51) Int. Cl.
*C09D 1/00* (2006.01)
*C09D 5/00* (2006.01)
(Continued)

(52) U.S. Cl.
CPC .............. *C09D 1/00* (2013.01); *B05D 3/02* (2013.01); *B05D 3/107* (2013.01); *C03C 17/006* (2013.01);
(Continued)

(58) Field of Classification Search
CPC .. C09D 1/00; C09D 5/00; C03C 17/25; C03C 17/00; H01L 31/0215; G02B 1/11; G02B 1/18
(Continued)

(56) References Cited

U.S. PATENT DOCUMENTS

2007/0034833 A1* 2/2007 Parce ................ C01B 19/007
252/301.36
2009/0205536 A1* 8/2009 Chiang ................ C09D 1/00
106/286.5
(Continued)

FOREIGN PATENT DOCUMENTS

EP  1 818 693  8/2007
EP  2 749 608  7/2014
(Continued)

OTHER PUBLICATIONS

International Search Report for PCT/EP2018/059744, dated Dec. 19, 2018, 5 pages.
(Continued)

*Primary Examiner* — Tahseen Khan
(74) *Attorney, Agent, or Firm* — Jed C. Benson

(57) ABSTRACT

A coated substrate comprising a coating layer with inorganic oxide and pores, the coating layer demonstrates improved anti-soiling properties. The coated substrate may for example be used in solar modules. Further a coating formulation and use of the coating formulation are disclosed.

26 Claims, 2 Drawing Sheets

(51) Int. Cl.
| | |
|---|---|
| *C03C 17/25* | (2006.01) |
| *C03C 17/00* | (2006.01) |
| *H01L 31/0216* | (2014.01) |
| *G02B 1/11* | (2015.01) |
| *G02B 1/18* | (2015.01) |
| *C09D 133/08* | (2006.01) |
| *C09D 133/12* | (2006.01) |
| *C09D 151/10* | (2006.01) |
| *B05D 3/02* | (2006.01) |
| *B05D 3/10* | (2006.01) |
| *C08K 3/36* | (2006.01) |

(52) U.S. Cl.
CPC ............ *C03C 17/25* (2013.01); *C03C 17/256* (2013.01); *C09D 5/00* (2013.01); *C09D 133/08* (2013.01); *C09D 133/12* (2013.01); *C09D 151/10* (2013.01); *G02B 1/11* (2013.01); *G02B 1/18* (2015.01); *H01L 31/02168* (2013.01); *C03C 2217/425* (2013.01); *C03C 2217/45* (2013.01); *C03C 2217/475* (2013.01); *C03C 2217/70* (2013.01); *C03C 2218/111* (2013.01); *C08K 3/36* (2013.01)

(58) Field of Classification Search
USPC ........................................................ 428/212
See application file for complete search history.

(56) References Cited

U.S. PATENT DOCUMENTS

| | | | |
|---|---|---|---|
| 2012/0135229 A1 | 5/2012 | Sawazaki et al. | |
| 2013/0163087 A1* | 6/2013 | Lecolley ................ | G02B 1/113 65/17.2 |
| 2013/0183489 A1 | 7/2013 | Cremer et al. | |
| 2013/0194668 A1 | 8/2013 | Liang et al. | |
| 2013/0202895 A1* | 8/2013 | Arfsten ............ | H01L 31/02168 106/122 |
| 2014/0009834 A1 | 1/2014 | Kalyankar | |
| 2014/0030429 A1* | 1/2014 | Aben ...................... | G02B 1/111 427/164 |
| 2014/0170308 A1* | 6/2014 | Kalyankar ............. | G02B 1/115 427/162 |
| 2014/0186613 A1* | 7/2014 | Liang ................... | C03C 17/007 428/328 |
| 2014/0356633 A1 | 12/2014 | Liang | |
| 2015/0059846 A1* | 3/2015 | Shiraishi ................. | C08K 3/36 428/323 |
| 2015/0132479 A1* | 5/2015 | Arfsten ..................... | C08J 3/128 524/379 |
| 2016/0291206 A1* | 10/2016 | Van Dijck et al. .... | C09D 5/022 |
| 2017/0243989 A1 | 8/2017 | Koyo et al. | |
| 2020/0123391 A1* | 4/2020 | Habets ................. | C09D 133/12 |

FOREIGN PATENT DOCUMENTS

| | | |
|---|---|---|
| EP | 2752386 A1 | 7/2014 |
| EP | 2808368 A1 | 12/2014 |
| EP | 3 153 550 | 4/2017 |
| JP | 2015021029 A | 2/2015 |
| JP | 2015075707 A | 4/2015 |
| JP | 2016045408 A | 4/2016 |
| JP | 2016204165 A | 12/2016 |
| WO | 2009030703 A2 | 3/2009 |
| WO | 2011/157820 | 12/2011 |
| WO | 2012/107392 | 8/2012 |
| WO | 2012107392 A1 | 8/2012 |
| WO | 2018192908 A2 | 10/2018 |

OTHER PUBLICATIONS

Written Opinion of the ISA for PCT/EP2018/059744, dated Dec. 19, 2018, 6 pages.

Zhang, Xianpeng, et al, Multifunctional Antireflection Coatings Based on Novel Hollow Silica-Silica Nanocomposites, ACS Appl. Mater., Interfaces 2014, 6, pp. 1415-1423.

* cited by examiner

Fig. 3.
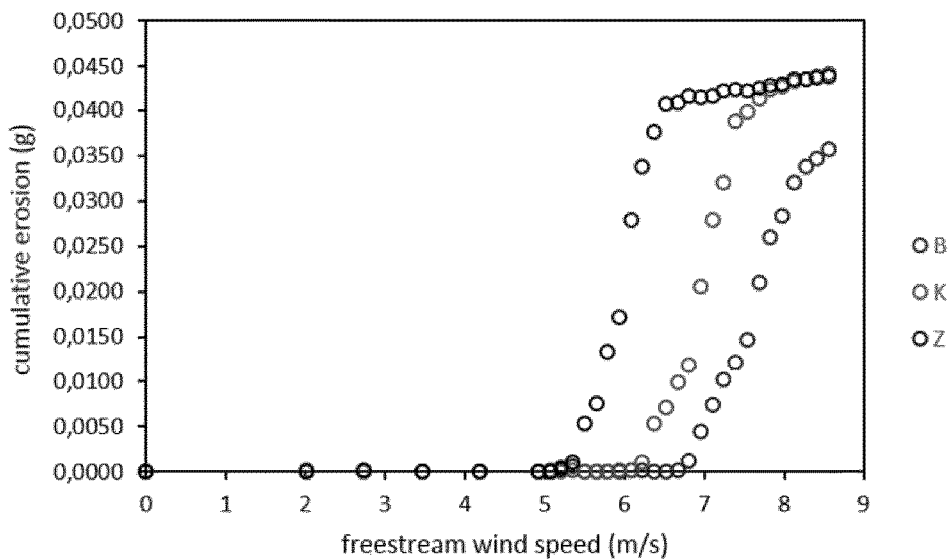
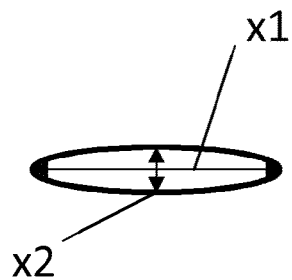
Fig. 4a
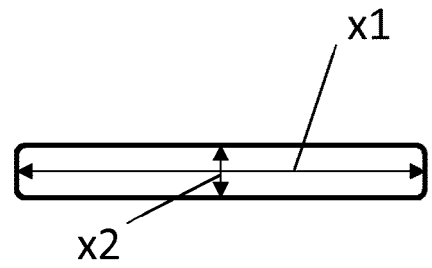
Fig. 4b
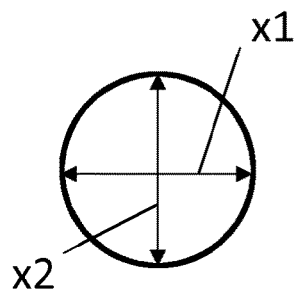
Fig. 4c
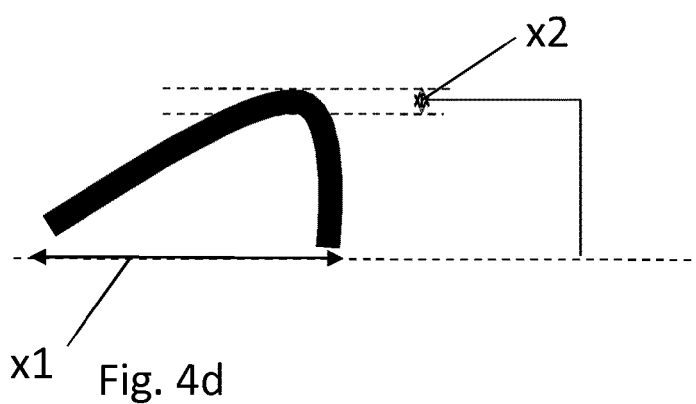
Fig. 4d

COATING AND COATING FORMULATION

This application is the U.S. national phase of International Application No. PCT/EP2018/059744 filed 17 Apr. 2018, which designated the U.S. and claims priority to EP Patent Application No. 17166912.0 filed 18 Apr. 2017, EP Patent Application No. 17180733.2 filed 11 Jul. 2017, and EP Patent Application No. 17192491.3 filed 21 Sep. 2017, the entire contents of each of which are hereby incorporated by reference.

TECHNICAL FIELD OF THE INVENTION

The invention relates to an anti-reflective coating. More particularly, the invention relates to an anti-reflective coating showing anti-soiling properties as well as a coated substrate, a coating formulation and a solar module, as well as a method of improving anti-soiling properties of a coating.

A coated substrate comprising a coating layer with inorganic oxide and pores is disclosed herein, the coating layer demonstrates improved anti-soiling properties. The coated substrate may for example be used in solar modules. Further a coating formulation and use of the coating formulation are disclosed.

BACKGROUND OF THE INVENTION

Anti-reflective (AR) coatings are coatings deposited on substrates, which require high transmission of light such as cover glasses for solar modules and green house glass, and said coatings are able to reduce the reflectivity of said substrates. Performance of solar modules tend to decrease over time amongst other reasons also due to soiling of the surface where light is transmitted through. In areas with high soiling rates, it was found that build-up of sand and dust particles provides a substantial contribution to the decreased performance.

OBJECTS OF THE INVENTION

It is the object of the invention to provide an improved coating.

In another aspect of the invention, it is an object of the invention to provide an improved coating formulation.

In a further aspect of the invention, it is an object of the invention to provide a method of improving anti-soiling properties of a coating.

The improvement may for example be achieving of improved anti-soiling properties of the coating, or another feature of the invention.

DISCLOSURE OF THE INVENTION

In a first aspect of the invention, the object is achieved by a coating formulation according to the claims, embodiments and aspects as described herein. In an aspect of the invention, the object is achieved by a coating formulation as described herein.

In further aspects of the invention, the objective is achieved by a method, a coated substrate, or a use according to the claims, embodiments and aspects as described herein,

BRIEF DESCRIPTION OF THE DRAWINGS

The invention is explained below with reference to exemplary embodiments as well as the drawings, in which FIG. 3 shows results of measurement of onset dust removal.

FIG. 4a schematically depicts an embodiment of an elongated particle used in the invention with an ellipsoidal shape (2D image of an prolate (elongated) spheroid), having a longer (which may also be referred to as major) axis having a length x1 perpendicular; a shorter (which may also be referred to as minor) axis perpendicular to the longer axis having a length x2; and an aspect ratio (x1/x2) of at least two.

FIG. 4b schematically depicts an embodiment of an elongated particle used in the invention with a rod-like shape, having a longer axis a having length x1; a shorter axis (smaller diameter) perpendicular to the longer axis having a length x2; and an aspect ratio (x1/x2) of at least two.

FIG. 4c schematically depicts a spherical particle, having a first axis having a length x1; a second axis perpendicular to the first axis having a length x2; and an aspect ratio (x1/x2) of about 1.

FIG. 4d schematically depicts an embodiment of an elongated particle used in the invention having an irregular shape, having a longer axis having a length x1; a shorter axis (smaller diameter, shortest dimension of the particle) perpendicular to the longer axis having a length x2 (the length of the longest straight line from one side of the particle to the other side of the particle); and an aspect ratio (x1/x2) of at least two.

DETAILED DESCRIPTION

Figure 1:
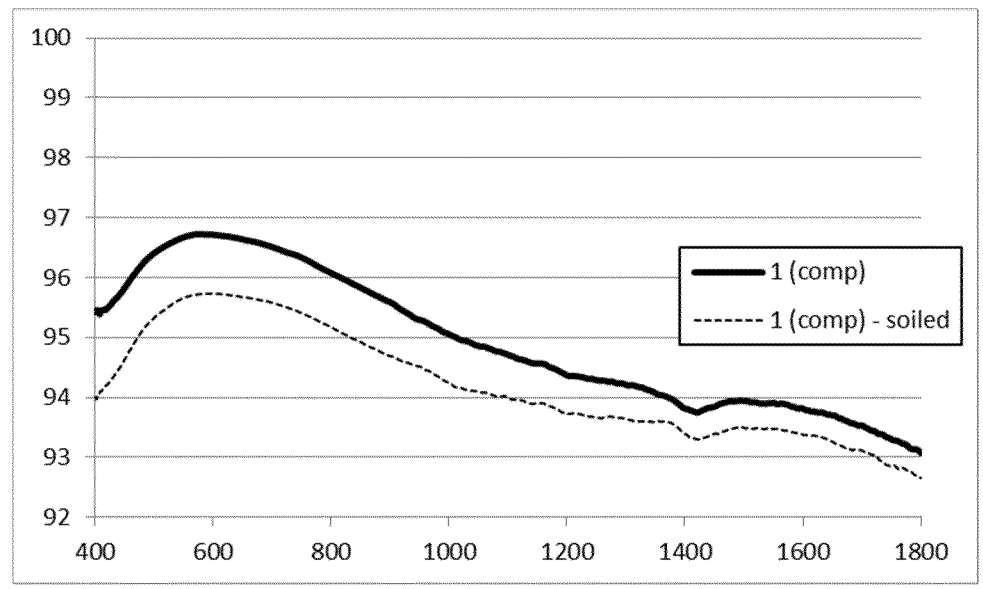
FIG. 1 shows optical properties of a comparative sample.

The invention relates to an improved coating.

Such improved coating may be obtained by converting a coating formulation into a functional coating for example by heating.

Typically by converting the coating formulation on a substrate into a coated substrate.

Coated substrates, such as a cover glass of a solar module comprising an anti-reflective coating, usually need cleaning at some point in time. In particular in arid areas of the world. Cleaning involves among others time and costs and creates waste cleaning materials. There is therefore a need to reduce the cleaning frequency of coated substrates. This invention addresses the reduction of cleaning via improved anti-soiling properties of the coated substrate. The invention provides a coated substrate demonstrating improved anti-soiling properties. The invention provides a coating formulation demonstrating improved anti-soiling properties after application of such formulation on a substrate and converting the dried coating formulation into a coated substrate. The invention provides a solar module demonstrating improved anti-soiling properties.

Improved anti-soiling properties may be demonstrated via reduced frequency of cleaning whilst having the same power output over a period of time e.g. 3 months. Improved anti-soiling properties may be demonstrated via an improved power output at the same frequency of cleaning over a period of time e.g. 3 months.

Anti-soiling properties may be determined via measuring the transmittance of the anti-reflective coating on a transparent substrate by means of a transmission measurement using a spectrophotometer. The spectrophotometer can be any spectrophotometer which is suitable to analyse a coated substrate. A suitable spectrophotometer includes a Shimadzu UV2600 spectrophotometer. Another suitable spectrophotometer includes an Optosol Transpec VIS-NIR spectrophotometer.

The improved anti-soiling properties may be demonstrated by an increased Anti-Soiling Ratio (ASR) as defined herein. Improved anti-soiling properties may be demonstrated by an increased substrate-coating anti-soiling ratio, ASR, as compared to a reference coated substrate. In an aspect improved anti-soiling properties may be demonstrated by a substrate-coating anti-soiling ratio, ASR, of at least 50%. In an aspect the ASR is at least 75%, in an aspect the ASR is at least 80%, in an aspect at least 85%, in an aspect the ASR is at least 90%.

In an aspect improved anti-soiling properties may be demonstrated by an increased substrate-coating anti-reflective effect, ARE, as defined herein.

Improved anti-soiling properties may be demonstrated by an increased ARE, as compared to a reference coated substrate. In an aspect the ARE is at least 2%, in an aspect the ARE is at least 3%, in an aspect the ARE is at least 4%, in an aspect the ARE is at least 5%.

In an aspect improved anti-soiling properties may be demonstrated by an increased Antisoiling gain, ASG, as defined herein. Improved anti-soiling properties may be demonstrated by an increased ASG, as compared to a reference coated substrate. In an aspect the ASG is at least 50%, in an aspect the ASG is at least 75%, in an aspect the ASG is at least 80%.

The coating formulation according to the invention provides improved anti-soiling properties.

The coating formulation according to the invention provides improved anti-soiling properties to a coating obtained from such formulation after curing i.e. by converting the coating formulation on a substrate into a coated substrate for example by heating, such as by heating above 400 degrees Celsius.

The method according to the invention provides a coated substrate demonstrating improved anti-soiling properties.

The present invention relates to a coating formulation comprising
  i. at least 2 wt-% based on inorganic oxide equivalents of elongated dense inorganic oxide particles with an aspect ratio of at least 2 and a smaller diameter in the range of 3 to 20 nm, and
  ii. a porogen capable of forming pores with a diameter in the range of 10 to 120 nm,
  iii. an inorganic oxide binder, and
  iv. a solvent,
    wherein the coating formulation comprises between 0.1 to 30 wt-% aluminium oxide equivalents of aluminium containing compound, preferably the coating formulation comprises between 0.5 to 30 wt-% aluminium oxide equivalents of aluminium containing compound.

In a first aspect of the invention, the object is achieved by a coating formulation comprising:
  i. at least 2 wt-% based on oxide equivalents of inorganics of elongated inorganic dense oxide particles with an aspect ratio of at least 2 and an average smaller diameter in the range of 3 to 20 nm as measured by TEM, and
  ii. a porogen capable of forming pores with a diameter in the range of 10 to 120 nm,
  iii. an inorganic oxide binder, and
  iv. a solvent,
    wherein the coating formulation comprises between 0.5 to 30 wt-% aluminium oxide equivalents of aluminium containing compound based on total ash rest after combustion at 600° C., 2 min in air, preferably the coating formulation comprises between 1.0 to 25 wt-% aluminium oxide equivalents of aluminium containing compound based on total ash rest after combustion at 600° C.

In an aspect of the invention the coating formulation comprises at least 2 wt-%, at least 3 wt %, at least 4 wt %, at least 5 wt %, at least 6 wt %, at least 7 wt %, at least 8 wt %, at least 9 wt %, at least 10 wt %, at least 11 wt %, at least 12 wt %, at least 13 wt %, at least 14 wt %, at least 15 wt % or at least 16 wt % based on inorganic oxide equivalents of elongated dense inorganic oxide particles with an aspect ratio of at least 2 and a smaller diameter in the range of 3 to 20 nm.

In an aspect of the invention the coating formulation comprises at least 17 wt-%, at least 18 wt %, at least 19 wt %, at least 20 wt %, at least 22 wt %, at least 25 wt % based on inorganic oxide equivalents of elongated dense inorganic oxide particles with an aspect ratio of at least 2 and a smaller diameter in the range of 3 to 20 nm.

In an aspect of the invention the coating formulation comprises at most 30 wt %, at most 28 wt %, at most 26 wt %, at most 25 wt %, at most 22 wt %, at most 20 wt %, at most 18 wt % at most 15 wt % based on inorganic oxide equivalents of elongated dense inorganic oxide particles with an aspect ratio of at least 2 and a smaller diameter in the range of 3 to 20 nm. In an aspect of the invention the coating formulation comprises between 0.1 to 30 wt-% aluminium oxide equivalents of aluminium containing compound, In an aspect of the invention the coating formulation comprises between 0.5 to 30 wt-% aluminium oxide.equivalents of aluminium containing compound. In an aspect of the invention the coating formulation comprises between 0.5 to 25 wt-% aluminium oxide equivalents of aluminium containing compound, comprises between 1.0 to 25 wt-% aluminium oxide equivalents of aluminium containing compound, between 2.0 and 20 wt % aluminium oxide equivalents of aluminium containing compound.

In an aspect of the invention the coating formulation comprises at least 0.1 wt %, at least 0.5 wt %, at least 1 wt %, at least 2 wt %, at least 3 wt %, at least 5 wt %, at least 7 wt % at least 10 wt %, at least 12 wt % aluminium oxide equivalents of aluminium containing compound.

In an aspect of the invention the coating formulation comprises 30 wt % or less, 25 wt % or less, 22 wt % or less, 20 wt % or less, 18 wt % or less, 14 wt % or less aluminium oxide equivalents of aluminium containing compound.

In further aspect of the invention, the objective is achieved by a method of preparing a coated substrate comprising the steps of:
  providing a substrate;
  providing a coating formulation according to any one of the embodiments 1 to 5 as described herein;
  applying the coating formulation on the substrate;
  drying the applied coating formulation on the substrate; and
  converting the dried coating formulation on the substrate into a coated substrate.

A method of preparing a coated substrate comprising the steps of:
  providing a substrate having a first surface;
  providing a coating formulation as described herein;
  applying the coating formulation on the first surface of the substrate;

drying the applied coating formulation; and
converting the substrate with dried coating formulation into a coated substrate comprising a coating layer on the first surface, for example by heating, such as by heating above 400 degrees Celsius.

In an aspect a base coating as described herein forms at least a part of the first surface of the substrate. In an aspect a base coating as described herein forms the first surface of the substrate.

In a further aspect of the invention, the objective is achieved by a coated substrate obtainable by a method as described herein, including a method comprising the steps of
providing a substrate;
providing a coating formulation according to any one of the embodiments 1 to 5 as described herein;
applying the coating formulation on the substrate;
drying the coating formulation on the substrate; and
converting the coating formulation on the substrate into a coated substrate.

The present invention further elates to a coated substrate comprising:
i. a substrate; and
ii. a porous anti-reflective coating layer arranged on at least a part of the substrate,
wherein the anti-reflective coating layer comprises
pores with a diameter in the range of 10 to 120 nm, preferably 30 to 100 nm; and
elongated dense inorganic oxide particles with an aspect ratio of at least 2, and a smaller diameter in the range of 3 to 20 nm; and
between 0.1 to 30 wt-% aluminium oxide equivalents of aluminium containing compound, preferably 0.5 to 30 wt-% aluminium oxide equivalents of aluminium containing compound.

The present invention further elates to a coated substrate comprising:
i. a substrate; and
ii. a porous anti-reflective coating layer arranged on at least a part of the substrate,
wherein the anti-reflective coating layer comprises
pores with a diameter in the range of 10 to 120 nm, preferably 30 to 100 nm; and
elongated dense inorganic oxide particles with an aspect ratio of at least 2, and a smaller diameter in the range of 3 to 20 nm; and
between 0.1 to 30 wt-% aluminium oxide equivalents of aluminium containing compound, preferably 0.5 to 25 wt-% aluminium oxide equivalents of aluminium containing compound.

In a further aspect of the invention, the objective is achieved by a use of a coating formulation comprising elongated inorganic oxide particles with an aspect ratio of at least 2 and a smaller diameter in the range of 3 to 20 nm for improving anti-soiling properties of a substrate, where the coating formulation comprising core-shell nanoparticle as porogen where the core comprises an organic compound, such as a polymer like a cationic polymer or an organic compound with a boiling point below 200° C., and the shell comprises an inorganic oxide, and between 0.5 to 20 wt-% aluminium oxide equivalents of aluminium containing compound based on total ash rest after combustion at 600° C., 2 min in air.

In a further aspect of the invention, the objective is achieved by a use of a coating formulation comprising elongated dense inorganic oxide particles with an aspect ratio of at least 2 and a smaller diameter in the range of 3 to 20 nm for improving anti-soiling properties of a substrate, wherein the coating formulation comprises core-shell nanoparticles as porogen, wherein the core comprises an organic compound, such as a polymer or an organic compound with a boiling point below 200° C., the shell comprises a inorganic oxide; and the formulation comprises between 0.1 to 30 wt-% aluminium oxide equivalents of aluminium containing compound.

In an aspect of the invention the polymer may be a cationic polymer.

The coating disclosed herein is a porous coating. The coating may be manufactured using a coating formulation comprising a binder and a porogen. The binder comprises inorganic binder particles, such as metaloxide particles, and or an inorganic oxide precursor. The porogen typically is an organic material that will decompose, burn, evaporate or be otherwise removed upon exposure to elevated temperature. Typically the elevated temperature is 400 degrees Celcius or more, such as 550 degrees Celsius or more, such as 600 degrees Celsius or more. Typically the organic material is an organic polymer. In an aspect porogen comprises an organic material comprising an organic polymer such as an organic neutral, an organic cationic an organic anionic polymer, an polylectrolytes or a combination thereof. The porogen typically comprises an organic polymer core and an inorganic oxide shell around the core. The coating according to the disclosure comprises inorganic particles such as elongated inorganic dense oxide particles. It is noted that elongated inorganic dense oxide particles and elongated dense inorganic oxide particles are used interchangeably herein. It is noted that elongated inorganic dense oxide particles and elongated massive metal oxide particles are used interchangeably herein.

In an aspect of the coating formulation according to the invention the elongated dense inorganic oxide particles accounts for 5 to 70 wt-% of the total amount of inorganic oxide equivalents in the coating formulation, preferably for 5 to 50 wt-% of the total amount of inorganic oxide equivalents in the coating formulation, more preferably for 10 to 45 wt-% of the total amount of inorganic oxide equivalents in the coating formulation, and most preferably for 12 to 30 wt-% of the total amount of inorganic oxide equivalents in the coating formulation. In an aspect of the coating formulation according to the invention the elongated dense inorganic oxide particles accounts for 5 to 15 wt-% of the total amount of inorganic oxide equivalents in the coating formulation.

In an aspect of the coating formulation according to the invention the elongated dense inorganic oxide particles accounts for at least 5 wt %, at least 7 wt % 8 wt %, at least 9 wt %, at least 10 wt %, at least 11 wt %, at least 12 wt %, at least 13 wt %, at least 14 wt %, at least 15 wt %, at least 16 wt %, at least 17 wt-%, at least 18 wt %, at least 19 wt %, at least 20 wt %, at least 22 wt %, at least 25 wt based of the total amount of inorganic oxide equivalents in the coating formulation.

In an aspect of the coating formulation according to the invention the elongated dense inorganic oxide particles accounts for 30 wt % or less, 28 wt % or less, 26 wt % or less, 25 wt % or less, 22 wt % or less, 20 wt % or less, 18 wt % or less or 15 wt % or less of the total amount of inorganic oxide equivalents in the coating formulation.

The coating according to the invention comprises pores with a diameter in the range of less than 1 nm up to about 120 nm. The pores may be open pores, such as an opening along a boundary between two particles and optionally connecting to the surface of the coating, and/or the pores may be closed, such as a (closed) hollow particle. It is preferred that the coating comprises pores with a diameter of 10 to 120 nm, referred to as porogen pores. For pores with a diameter of more than 10 nm, the pore diameter can be estimated by electron microscopy. For pores with a diameter below 10 nm, ellipsometry can be used to determine the size. Porogen pores are preferably of substantially regular shape, such as spherical or ellipsoidal (with one or two long axes) pores. In an aspect, porogen pores are preferably of substantially regular shape, such as spherical or ellipsoidal (with one or two long axes) pores, but should not have an aspect ratio of more than 5 as this may negatively influence the mechanical properties of the coating. A hollow particle, such as an hollow inorganic oxide particle may be defined as a particle with an inorganic oxide shell with a hollow core. Porogen pores may be defined by a hollow inorganic oxide particle, such as for example hollow inorganic oxide particles and may originate from core-shell particles having an inorganic oxide (or inorganic oxide precursor) shell and an organic polymer based core, so that upon curing of the coating the polymer will be removed. Upon curing of the coating formulation the polymer will be decomposed/removed and the coating is formed. Porogen pores may be defined by a hollow inorganic oxide particle, such as for example hollow inorganic oxide particles and may originate from core-shell particles having an inorganic oxide (or inorganic oxide precursor) shell and a core material comprising an organic polymer and/or an organic compound, so that upon curing of the coating the core material will be removed. Upon curing of the coating formulation the core material will be decomposed/removed such that a porous coating is formed. The pore typically originates from an organic porogen, that during conversion of the coating formulation into a functional coating typically will be decomposed, burned, evaporated or otherwise removed.

In an aspect a suitable curing temperature is at least 400 degrees Celsius. In an aspect a suitable curing temperature is at least 550, in an aspect at least degrees 600 Celsius. Pores may also be defined by a combination of inorganic binder particles and/or dense inorganic oxide particles. In this case, the pore typically originates from an organic porogen, such as a polymer particle or another porogen, that during conversion of the coating formulation into a functional coating typically will be decomposed, burned, evaporated or otherwise removed. Porogens include organic neutral, cationic and anionic polymers or polyelectrolytes (see e.g. Fuji, M.; Takai, C.; Rivera Virtudazo, R. V.; *Adv. Powder Tech.,* 2014, 25, 91-100; Zhang, X. et al., *App. Mater. Interfaces,* 2014, 6, 1415-1423)

In the present disclosure the pore typically originates from an organic porogen, such as a polymer particle or another porogen, that during conversion of the coating formulation into a functional coating typically will be decomposed, burned, evaporated or otherwise removed. It should be observed that conversion does not encompass polymerization of organic (monomeric) compounds as the binder is an inorganic oxide based binder and the conversion therefore is of a sintering type conversion where organics are at least partially removed and metal oxide particles at least partially sinter together.

In addition to porogen pores, smaller pores are also present at least in the binder. In the context of the present invention, binder pores are therefore pores with a diameter of 1 to below 10 nm. Binder pores are typically not regular but extended pores in non-contacting regions between adjacent particles of binder, dense inorganic oxide particles and hollow nano particles (if present) and may form a network, which may or may not be in connection with the surface of the coating or with the porogen pores.

The coating according to the invention is a porous coating. By porous is herein meant that the coating has pores and a porosity of at least 2%. The maximum porosity depends on mechanical requirements of the coating layer and is typically 50% or less, preferably the porosity is less than 45% and more preferably the porosity is less than 40%. In an aspect such coating layer has a porosity of 2 to 50%. A high porosity generally increases anti-reflective performance but may reduce mechanical strength of a coating. In an aspect the porous anti-reflective coating layer has of porosity of 2% or more, 5% or more, 10% or more, 15% or more, 20% or more, 25% or more, 30% or more. In an aspect the porous anti-reflective coating layer has of porosity 50% or less, 45% or less, 40% or less. In an aspect the porous anti-reflective coating layer has of porosity of 25 to 40%. In an aspect the porous anti-reflective coating layer has of porosity of 30 to 40%. As is well known by the skilled person, image analysis may suitably be performed on a SEM photo. The person skilled in the art known how to identify pores and the amount of pores and is able to calculate the porosity therefrom.

Alternatively the skilled person may calculate the porosity from a measured refractive index (RI). Knowing the RI of a coating material without any pores, the skilled person can calculate how much air/pore volume is present in the coating layer. The coating material herein is the total inorganic oxide material after convert the coating formulation into a functional coating for example by heating. Total inorganic oxide material includes all inorganic oxide material in the coating e.g. material of the binder, plus the material of the inorganic oxide shell, plus aluminium containing compound(s).

In an aspect porosity is determined by image analysis on a SEM photo of a cross section of the coating layer orthogonal to the substrate.

In an aspect of the invention the coating layer of the coated substrate has a porosity of 2 to 50%.

The coating according to the invention also comprises elongated dense inorganic oxide particles with an aspect ratio of at least 2, and a smaller diameter in the range of 3 to 20 nm. Preferably the smaller diameter is in the range of 5 to 20 nm. By elongated is meant that at least one of the dimensions of the particle is much longer, such as at least 2, 3, 4, 5, 8, 10, 15 or 20 times the length of another dimension of the particle. It is preferred that the length of the elongated dense inorganic oxide particle is less than 50 times the length of another dimension of the particle, such as at most, 50, 30, 25, 20 or 15 times the length of another dimension of the particle. When the particle has an irregular shape, the aspect ratio is calculated as the length of the longest straight line from one side of the particle to the other side of the particle (even though this may mean that the straight line may be outside the particle) divided by the shortest dimension of the particle transverse to the longest straight line anyway along the straight line. Examples of elongated dense inorganic oxide particles are IPA-ST-UP (Nissan Chemical) and Bindzil 15/750LS (Akzo Nobel) and others are commercially available.

The elongated particle has an aspect ratio of at least two and may, without being limited thereto, have an ellipsoidal, a rod-like or an irregular shape. The elongated particle as used in the invention has a longer axis (which may also be referred to as major) having length x1; and a shorter axis perpendicular to the longer axis (which may also be referred to as minor) having a length x2; and an aspect ratio (x1/x2) of at least two.

The aspect ratio is calculated by dividing the length of the longest axis by the smaller axis. The longest axis may also be referred to as major axis. The smaller axis may also be referred to as the minor axis, the smaller diameter or the shortest dimension of the particle.

Typically for determining the length of an axis of a particle the outside surface of the particle is used.

By dense is meant that the inorganic oxide particle has low or no porosity, such as a porosity of less than 5 vol-% or no porosity. In an aspect the elongated dense inorganic oxide particle has a porosity of 0.5-5 vol-%, in an aspect 1-4 vol-%, in an aspect 1-3 vol-% porosity.

By porogen is herein meant an entity capable of forming pores with a diameter of 10 to 120 nm, preferably 30 to 100 nm, in the final coating may for example be hollow particle; a core-shell particle with a core with a boiling point below the curing temperature of the coating formulation or a core, which is combustable or depolymerizable below the curing temperature; a particle, which is combustable or depolymerizable below the curing temperature. Porogen may also be referred to as pore forming agent. A core with a boiling point below the curing temperature boiling point has a decomposition temperature of below the curing temperature. A core which is combustable or depolymerizable below the curing temperature is a core that is decomposed or depolymerized, or a combination thereof, during curing, i.e. at a temperature which is below the curing temperature. As a result the core is removed and a pore is formed.

Thus by porogen, or pore forming agent, is herein meant an entity capable of forming pores with a diameter of 10 to 120 nm, preferably 30 to 100 nm, in the final coating. The porogen may be a polymer particle e.g. a polystyrene particle, Pluronic P123 and/or a PMMA particle. The porogen may for example be hollow particle. The porogen may for example be a hollow silica particle. The porogen may for example be a core-shell particle with a core having a boiling point below the curing temperature of the coating formulation. The porogen may be a core-shell particle with a core that is combustable or depolymerizable below the curing temperature or a particle, that is combustable or depolymerizable below the curing temperature. A core having a boiling point below the curing temperature comprises a material having boiling point of below the curing temperature. A core which is combustable or depolymerizable below the curing temperature comprises a material that is decomposed or depolymerized, or a combination thereof, during curing, i.e. at a temperature below the curing temperature. As a result the compound is removed and a pore is formed.

By oxide equivalents of inorganics is herein meant the metal oxides including silicon oxide irrespective of the actual compound that the inorganic species is present in so for example tetraethoxysilane would count as $SiO_2$ irrespective if the species present is tetraethoxysilane, partially hydrolysed tetraethoxysilane or $SiO_2$. i.e. by oxide equivalents of inorganics is herein meant the equivalent amount of metal oxides including silicon oxide that can be formed from the actual compound or inorganic oxide precursor used. So for example a certain amount of tetraethoxysilane would be expressed as $SiO_2$ equivalent irrespective if the species present is tetraethoxysilane, partially hydrolysed tetraethoxysilane or $SiO_2$. Analogous for Alumina, one calculates the amount of pure $Al_2O_3$ that could be formed. Aluminum oxide equivalents are calculated back to theoretical $Al_2O_3$ amount based on the alumina precursor added to the formulation.

The alumina precursor may include
- Al(III) complexes such as halogen-based salts of Al(III) in the form of AlX3 where X can be F, Cl, Br, I and their hydrate form;
- Al(III) inorganic salts such as Al(III) nitrates, nitrites, sulfites, sulfates, phosphates, chlorates, perchlorates, carbonates and their hydrate form;
- Al(III) complexes bearing oxygen or nitrogen donor based ligands which are hydrolysable such as alkoxides or amides; and
- combinations thereof.

The alumina precursor may include any of Al(isopropoxide)3, Al(sec-butoxide)3, Al(NO3)3, AlCl3 or a combination thereof.

The silica precursor may include TEOS (tetraethoxysilane), TMOS (tetramethoxysilane), alkylsilanes such as (R)xSi (OCH3)4-x where R=CH3; C2H5; OCH3 of OC2H5 or a combination thereof.

In an aspect the inorganic oxide equivalents are based on total ash rest after combustion at 600° C., 2 min in air. As the skilled person knows total ash rest after combustion at 600° C., 2 min in air is the total residual solid material after combustion at 600° C., 2 min in air.

For instance for silica, one starts from alkoxysilane. When it is referred to oxide equivalents, the assumption is made that only pure $SiO_2$ is formed. Analogous for Alumina, if started from Al(NO3)3 one calculates the amount of pure $Al_2O_3$ that could be formed.

For example for 10 grams of tetraethyl orthosilicate (TEOS), the amount of inorganic oxide equivalents is calculated as follows:

$$SiO_2 = \frac{\text{amount } TEOS \text{ [g]}}{Mw \, TEOS} * Mw \, SiO_2 \qquad \text{eq.}$$

i.e. eq. $SiO_2$=oxide equivalents of inorganics=10/208.33*60.08=2.88 g

For example for 1 gram elongated dense inorganic oxide particles with an aspect ratio of at least 2 and an average smaller diameter in the range of 3 to 20 nm), the amount of inorganic oxide equivalents is calculated as follows:

The elongated particles used in the examples are considered to be pure SiO2. So 1 gram elongated particles, is equivalent to 1 g inorganic oxide (here 1 gram SiO2).

In one embodiment, the porogen account for a significant part of the total amount of inorganic oxide in the coating formulation. Preferably, the porogen accounts for 10 to 75 wt-% of the total amount of inorganic oxide in the coating formulation, and more preferably the porogen accounts for 20 to 50 wt-% of the total amount of inorganic oxide in the coating formulation. This may for example be the situation when the porogen is a core shell particle or a hollow particle.

In another embodiment, the elongated dense inorganic oxide particles account for a significant amount of the inorganic oxide in the coating formulation. Preferably the elongated dense oxide particles account for 5 to 70 wt-% of the total amount of inorganic oxide in the coating formulation, more preferably for 5 to 50 wt-% of the total amount of inorganic oxide in the coating formulation, and even more preferably for 10 to 45 wt-% of the total amount of inorganic oxide in the coating formulation, such as 12 to 30 wt-% of the total amount of inorganic oxide in the coating formulation. In an aspect of the coating formulation according to the invention the elongated dense inorganic oxide particles accounts for 5 to 15 wt-% of the total amount of inorganic oxide in the coating formulation. In an aspect of the coating formulation according to the invention the elongated dense inorganic oxide particles accounts for at least 5 wt %, at least 7 wt % 8 wt %, at least 9 wt %, at least 10 wt %, at least 11 wt %, at least 12 wt %, at least 13 wt %, at least 14 wt %, at least 15 wt %, at least 16 wt %, at least 17 wt-%, at least 18 wt %, at least 19 wt %, at least 20 wt %, at least 22 wt %, at least 25 wt based of the total amount of inorganic oxide in the coating formulation. In an aspect of the coating formulation according to the invention the elongated dense inorganic oxide particles accounts for 30 wt % or less, 28 wt % or less, 26 wt % or less, 25 wt % or less, 22 wt % or less, 20 wt % or less, 18 wt % or less or 15 wt % or less of the total amount of inorganic oxide in the coating formulation.

The inorganic oxide may be any oxide known from glass coatings. The inorganic oxide may be any known from glass coatings including metal oxides such as for example $Al_2O_3$, $SiO_2$, $TiO_2$, $ZrO_2$, oxides of lanthanides and mixtures (including mixed oxides) thereof. The inorganic oxide may be any known from glass coatings including metal oxides, compounds and mixtures comprising for example $Al_2O_3$, $SiO_2$ and optionally one or more of of Li2O, BeO, BaO, MgO, K2O, CaO, MnO, NiO SrO, FeO, Fe2O3, CuO, Cu2O, CoO, ZnO, PbO, GeO2, SnO2, Sb2O3, Bi2O3. It is preferred that the inorganic oxide contains silica, preferably the inorganic oxide contains at least 50 wt-% silica and more preferably the inorganic oxide is at least 90 wt-% silica, such as the inorganic oxide consisting of silica.

The coated substrate according to the invention may for example be prepared by a method comprising the steps of providing a substrate; providing a coating formulation according to the first aspect of the invention; apply the coating formulation on the substrate; drying the coating formulation on the substrate; and converting the coating formulation on the substrate into a coated substrate. It should be observed that the conversion does not involve polymerization of an organic polymer but rather a consolidation of the binder and/or conversion of the porogen into a pore in the coating. This may be by heating for example combined with a tempering process of a glass substrate, but may alternatively involve evaporation of solvent in a solvent templated particle, which may take place at a much lower temperature.

In case the core comprises a solvent, e.g. in a solvent templated particle, conversion of the porogen into a pore may involve evaporation of solvent, for example at temperature below 250° C. The solvent may have a boiling point of at most 250° C., or at most 200, 175 or 150° C. In such situation, a substrate comprising an applied coating formulation according to the invention is converted into a coated substrate comprising a coating layer on the first surface by exposing the applied coating formulation to a temperature of below 250° C. In an aspect by exposing the applied coating formulation to a temperature of below 200, below 175 or below 150° C.

An anti-reflective coating comprising IPA-ST-UP particles (elongated particles) and inorganic binder is disclosed in WO2007/093341. However, WO2007/093341 does not indicate any relevance to anti-soiling properties and does not disclose presence of pores having a diameter of 10-120 nm in the coating, and particularly not pores of a diameter of 30-100 nm.

When the coating is applied to a substrate, such as a glass sheet, the coating will have an inner surface facing towards the substrate and an outer surface facing away from the substrate. In one embodiment, the elongated dense inorganic oxide particles are not distributed homogeneously in the coating. Particularly, it was found to be advantageous that the mass ratio of inorganic oxide originating from elongated dense inorganic oxide particles to total inorganic oxide of the coating is higher in or near the outer surface of the coating. Here, outer surface refers to the surface of the coating away from the substrate, which surface typically is exposed to the atmosphere.

$$\left(\frac{M_{elongated\ massive\ metal\ oxide\ particles}}{M_{total\ metal\ oxide}}\right)_{Surface} > \left(\frac{M_{elongated\ massive\ metal\ oxide\ particles}}{M_{total\ metal\ oxide}}\right)_{Average}$$

The distribution may for example be determined by STEM-EDX or by depth profiling. Thus the distribution of elongated dense inorganic oxide particles in a coating may for example be determined by STEM-EDX or by depth profiling. This is particularly advantageous when the chemical composition of the dense inorganic oxide particles and the overall formulation is not the same.

In an aspect of the coating according to the invention the mass ratio of inorganic oxide originating from elongated dense inorganic oxide particles to total inorganic oxide of the coating is higher in or near the outer surface of the coating as compared to a reference coating. A suitable reference coating may be a coating without elongated dense inorganic oxide particles.

It was found to be advantageous if the ratio is higher in the 20 nm of the coating closest to the outer surface than the average mass ratio of the inorganic oxide originating from elongated dense inorganic oxide particles to total inorganic oxide of the coating. In an aspect the ratio of inorganic oxide originating from elongated dense inorganic oxide particles to total inorganic oxide of the coating is at least 50% higher in the 20 nm of the coating closest to the outer surface compared to the average ratio of the inorganic oxide originating from elongated dense inorganic oxide particles to total inorganic oxide of the coating. Particularly, it was found to be advantageous when the ratio is higher in the 20 nm of the coating closest to the outer surface that the average mass ratio of the inorganic oxide originating from elongated dense inorganic oxide particles to total inorganic oxide of the coating. Preferably the ratio of inorganic oxide originating from elongated dense inorganic oxide particles to total inorganic oxide of the coating is at least 50% higher in the 20 nm of the coating closest to the outer surface that the average ratio of the inorganic oxide originating from elongated dense inorganic oxide particles to total inorganic oxide of the coating, and more preferably the ratio of inorganic oxide originating from elongated dense inorganic oxide particles to total inorganic oxide of the coating is at least twice as high in the 20 nm of the coating closest to the outer surface that the average ratio of the inorganic oxide originating from elongated dense inorganic oxide particles to total inorganic oxide of the coating. It could be theorized without being limited thereto that improved anti-soiling properties associated with this distribution of the elongated dense inorganic oxide particles is related to the slight change in surface morphology observed when elongated dense inorganic oxide particles are arrange near or at the surface of the coating.

In an aspect the coated substrate according to the invention demonstrates the mass ratio of inorganic oxide originating from the elongated dense inorganic oxide particles to total inorganic oxide of the coating being higher in a 20 nm thick top layer of the coating closest to the outer surface of the coated substrate than the average mass ratio of the inorganic oxide originating from dense inorganic oxide particles to total inorganic oxide of the coating.

In an aspect the mass ratio of inorganic oxide originating from the dense inorganic oxide particles to total inorganic oxide of the coating is at least 50% higher in the top layer of the coating than the average mass ratio of the inorganic oxide originating from elongated dense inorganic oxide particles to total inorganic oxide of the coating. In an aspect the mass ratio of inorganic oxide originating from the elongated dense inorganic oxide particles to total inorganic oxide of the coating is at least twice as high in the top layer the coating than the average mass ratio of the inorganic oxide originating from dense inorganic oxide particles to total inorganic oxide of the coating.

The coating according to the invention shows improved anti-soiling properties. The improved anti-soiling properties may be demonstrated by an increased Anti-Soiling Ratio (ASR) as defined by:

$$ASR = \frac{(T_{Substrate,0} - T_{Substrate,soil}) - (T_{Coating,0} - T_{Coating,soil})}{(T_{Substrate,0} - T_{Substrate,soil})} \times 100\%$$

where "T" is the average transmittance from 400-1200 nm measured by a spectrophotometer, Substrate refer to substrate without coating, Coating refers to the substrate with double sided coating. "0" refer to the measured transmittance before the soil test and "soil" refers to transmittance after soil test. From 400-1200 nm means from 400 to 1200 nm including 1200 nm. In an aspect "T" is the average transmittance from 400-1200 nm measured by a Shimadzu UV2600 spectrophotometer. In an aspect "T" is the average transmittance from 400-1200 nm measured by an Optosol Transpec VIS-NIR spectrophotometer. In an aspect the coated substrate demonstrates an ASR of at least 50%. In an aspect the coated substrate demonstrates an ASR of at least 75%. In an aspect the coated substrate demonstrates an ASR of at least 80%. In an aspect the coated substrate demonstrates an ASR of at least 90%.

The improved anti-soiling properties may be demonstrated by an increased Anti-Soiling Ratio (ASR) as defined by:

$$ASR = \frac{(T_{Substrate,0} - T_{Substrate,soil}) - (T_{Coating\ with\ Al,0} - T_{Coating\ with\ Al,soil})}{(T_{Substrate\ with\ Al,0} - T_{Substrate\ with\ Al,soil})} \times 100,$$

where "T" is the average transmittance from 400-1200 nm measured by a spectrophotometer, Substrate refer to substrate without coating, Coating refers to a double side coated substrate with the coating with alumina and elongated particles, "0" refers to the measured transmittance before the soil test and "soil" refers to transmittance after soil test. In an aspect "T" is the average transmittance from 400-1200 nm measured by a Shimadzu UV2600 spectrophotometer. In an aspect "T" is the average transmittance from 400-1200 nm measured by an Optosol Transpec VIS-NIR spectrophotometer. In an aspect the coated substrate demonstrates an ASR of at least 50%. In an aspect the coated substrate demonstrates an ASR of at least 75%. In an aspect the coated substrate demonstrates an ASR of at least 80%. In an aspect the coated substrate demonstrates an ASR of at least 90%.

For the avoidance of doubt it is noted that "Coating with Al" refers to a double side coated substrate with the coating comprising alumina and elongated particles.

In an aspect the invention provides a coated substrate demonstrating a substrate-coating anti-soiling ratio, ASR, with $$ASR = \frac{(T_{Substrate,0} - T_{Substrate,soil}) - (T_{Coating,0} - T_{Coating,soil})}{(T_{Substrate,0} - T_{Substrate,soil})} \times 100\%$$

of at least 50%, preferably the substrate-coating ASR is at least 75%, more preferably the substrate-coating ASR is at least 80%, and most preferably the substrate-coating ASR is at least 90%, wherein T is the average transmittance from 400-1200 nm, Substrate refers to substrate without coating, Coating refers to the substrate with double sided coating, 0 refers to before soil test and soil refers to after soil test.

The coating according to the invention was found to be particularly advantageous when the coating is an anti-reflective coating on a transparent substrate and the coating exhibit a substrate-coating anti-soiling ratio, ASR, with $$ASR = \frac{(T_{coated\ substrate\ without\ AlSubstrate,0} - T_{coated\ substrate\ without\ AlSubstrate,soil}) - (T_{Coating,0} - T_{Coating,soil})}{\left(T_{coated\ substate\ without\ AlSubstrate,0} - T_{coated\ substrated\ without\ AlSubstrate,soil}\right)}$$

was at least 50%. Here "T" is the average transmittance from 400-1200 nm measured by a Shimadzu UV2600 spectrophotometer, Substrate refer to substrate without coating, Coating refer to the substrate with double sided coating. "0" refer to the measured transmittance before the soil test and "soil" refer to transmittance after soil test. The soil test is conducted as described in the experimental part.

A soil test may include:
a) Providing a substrate with a surface to be tested;
b) Cleaning the surface to be tested to obtain a cleaned surface;
c) Measuring the transmittance from 400-1200 nm of the cleaned surface before soiling and determining the average transmittance in the range from 400 to 1200 nm (TO);
d) Soiling the surface to be tested with dust to obtain a dusted soiled surface;
e) Oscillating the substrate having the dusted surface;
f) removing excess dust from the dusted surface to obtain a soiled surface; and
g) measuring the transmittance from 400-1200 nm of the soiled surface after soiling (transmittance after soiling) and determining the average transmittance in the range from 400 to 1200 nm (Tsoil).

This way the following values may be obtained:
in step c) $T_{Substrate,0}$: the average transmittance from 400-1200 nm of the uncoated glass surface (substrate without coating) before soil test;
in step g) $T_{Substrate,soil}$ the average transmittance from 400-1200 nm of the uncoated glass surface after soil test;
in step c) $T_{Coating,0}$: the average transmittance from 400-1200 nm of the coated glass surface (coating with double sides coating) before soil test;

in step g) $T_{Coating,soil}$: the average transmittance from 400-1200 nm of the coated glass surface after soil test.

$T_{Coating,0}$ may also be referred to herein as $T_{coated\ substrate,0}$ or $T_{coated\ substrate\ with\ Al,0}$ or $T_{coated\ substrate\ without\ Al,0}$.

$T_{Coating,soil}$ may also be referred to herein as $T_{coated\ substrate,soil}$ or $T_{coated\ substrate\ with\ Al,soil}$ or $T_{coated\ substrate\ without\ Al,soil}$.

In step e) of the soil test Oscillating may be done by 300 cycles at a speed of 100 cycles per minute; one cycle being defined as a full revolution of the circular drive disk: one completed back-and-forth movement of the tray of a Taber Oscillating table.

In step f) of the soil test removing excess dust may be done by manually gently tapping a thin edge of the substrate (the side of the glass plate) on a hard surface, such as a table top.

Removing excess dust may be followed by cleaning the back side (the front side being the surface to receive the incident light in the spectrophotometer) of the soiled substrate (soiled glass plate) by gently wiping the back side surface with a soft cloth;

In an aspect cleaning comprises: cleaning with deionized water and a soft cloth, rinsing with laboratory grade ethanol and leaving to dry overnight.

Preferably cleaning is done at a relative humidity of below 40%.

Soil test and soiling test are used interchangeably herein.

Herein the average transmittance from 400-1200 nm means the average transmittance value in the wavelength range of 400 to 1200 nm.

In an aspect the transmittance is measured using an Optosol Transpec VIS-NIR spectrophotometer.

In an aspect the transmittance is measured using an Shimadzu UV2600 spectrophotometer.

In an aspect the soil test, in particular step d) and e) above, is performed using a Taber Oscillating Abrasion Tester (such as model 6160).

ASR indicates how well the coating improves the anti-soiling properties of the substrate. An ASR of 50% hence means that the coating only loses half the transmittance compared to the transmittance loss of the naked substrate. A naked substrate herein is a substrate without a coating layer, e.g. an uncoated piece of glass. Preferably the substrate-coating ASR of the coating is at least 75%, more preferably the substrate-coating ASR is at least 80%, and most preferably the substrate-coating ASR is at least 90%. ASR cannot be higher than 100% since this would mean that the coating is better after soiling, so the ASR should be maximum 100%.

The improved anti-soiling properties may be demonstrated by an increased Anti-Soiling Gain (ASG) with, $$ASG = \left[1 - \frac{(T_{coated\ substrate\ with\ Al,0} - T_{coated\ substrate\ with\ Al,soil})}{(T_{coated\ substrate\ without\ Al,0} - T_{coated\ substrate\ without\ Al,soil})}\right] \times 100\%$$

where T is the is the average transmittance from 400-1200, Coated Substrate with Al refers to a double side coated substrate with the coating with alumina and elongated particles and Coated Substrate without Al refers to a double side coated substrate with same coating where the alumina and dense inorganic oxide particles are excluded, 0 refer to before soil test and soil refer to after soil test, 0 refers to before soil test and soil refer to after soil test.

In an aspect the coated substrate according to the invention demonstrates by an Anti-Soiling Gain (ASG) of at least 50%, in an aspect of at least 75%. The invention provides a coated substrate having an Anti-Soiling Gain, ASG, with $$ASG = \left[1 - \frac{(T_{coated\ substrate\ with\ Al,0} - T_{coated\ substrate\ with\ Al,soil})}{(T_{coated\ substrate\ without\ Al,0} - T_{coated\ substrate\ without\ Al,soil})}\right] \times 100\%$$

of at least 50%, preferably the ASG is at least 75%, where T is the is the average transmittance from 400-1200 nm, Coated Substrate with Al refers to a double side coated substrate with the coating with alumina and elongated particles and Coated Substrate without Al refers to a double side coated substrate with same coating where the alumina and dense inorganic oxide particles are excluded, 0 refers to before soil test and soil refer to after soil test.

The coating according to the invention was also found to often fulfill the requirement that the antisoiling gain, ASG Coated substrate according to any one of the embodiments 3 to 7 as disclosed herein, wherein the coated substrate has an Antisoiling gain, ASG, $$ASG = 1 - \frac{(T_{coated\ substrate\ with\ Al,0} - T_{coated\ substrate\ with\ Al,soil})}{(T_{coated\ substrate\ without\ Al,0} - T_{coated\ substrate\ without\ Al,soil})}$$

of at least 50%, preferably the ASG is at least 75%, where T is the is the average transmittance from 400-1200 nm measured by a Shimadzu UV2600 spectrophotometer. Coated Substrate with Al refer to a double side coated substrate with the coating with alumina and elongated particles and Coated Substrate without Al refer to a double side coated substrate with same coating except the alumina and dense inorganic oxide particles are excluded, 0 refer to before soil test and soil refer to after soil test. 0 refer to before soil test and soil refer to after soil test.

In an aspect the invention provides a coated substrate obtainable by the method of preparing a coated substrate according to the invention, demonstrating improved anti-soiling properties.

In an aspect the invention provides a coated substrate comprising:
  i. a substrate; and
  ii. a porous anti-reflective coating layer arranged on at least a part of the substrate,
wherein the anti-reflective coating comprises
  pores with a diameter in the range of 10 to 120 nm, preferably 30 to 100 nm; and
  elongated dense inorganic oxide particles with an aspect ratio of at least 2, and a smaller diameter in the range of 3 to 20 nm; and
  between 0.1 to 30 wt-% aluminium oxide equivalents of aluminium containing compound, preferably 0.5 to 30 wt-% aluminium oxide equivalents of aluminium containing compound.

In an aspect of the invention the anti-reflective coating layer comprises at least 0.1 wt %, at least 0.5 wt %, at least 1 wt %, at least 2 wt %, at least 3 wt %, at least 5 wt % at least 7 wt % at least 10 wt %, at least 12 wt % aluminium oxide equivalents of aluminium containing compound.

In an aspect of the invention the anti-reflective coating comprises 30 wt % or less, 25 wt % or less, 22 wt % or less, 20 wt % or less, 18 wt % or less, 14 wt % or less aluminium oxide equivalents of aluminium containing compound.

The porous anti-reflective coating layer may also be referred to herein as coating.

In a preferred embodiment of the coated substrate according to the invention, the coated substrate has an onset dust removal below 5.5 m/s, preferably the onset dust removal is between 5.5 m/s and 4 m/s. This allows for ready removal of the dust that settle on the coated substrate by wind as well as facilitate cleaning of the coated substrate. An onset dust removal as described herein is the wind speed for onset of soiling removal, i.e. the wind speed at which a soiling medium, which has been deposited on the surface, starts to be blown away from the surface. Soiling medium may also be referred to as dust herein.

The onset dust removal may be determined e.g. in a closed-return wind tunnel. For example by placing glass slides horizontal on the floor (at 0° tilt angle) and applying the soiling medium. A suitable amount of soiling medium includes 2-6 gram/m$^2$, such as 4 g/m$^2$. Relative humidity may be kept in a predetermined range e.g. between 58 and 62%. The quantity of remaining dust may be measured by a high-precision balance. The windspeed at which the soiling started to be blown away from the surface is referred to as the onset dust removal. This means the weight of the plate including dust after applying the wind at a certain speed is lower than the weight before applying such wind. Suitable soiling medium includes Belgian Brabrantian loess. Suitable soiling medium includes Arizona test dust from quartz A4 coarse (size varying from 1 to 200 μm), Suitable soiling medium includes Arizona ISO12103-1 A2 fine sand, Arizona ISO12103-1 A4 coarse sand, Dust Mix "China fine", Dust Mix "China coarse", all commercially available at KSL staubtechnik gmbh, Germany.

The substrate is a solid material, such as a polymer sheet or a glass member. The substrate may include quartz or polymer foil, such as glass foil. Examples of polymer substrates are plastic foils and polymers based on one or more of the polymers selected from Polyethylene terephthalate (PET), Polymethyl methacrylate (PMMA), Polyethylene naphthalate (PEN). A further example of a polymer substrate includes polyimide (PI). Polymer substrates are advantageous for flexible solar cells. Preferably the substrate is transparent. Preferably, the substrate is a glass member being selected from the group of float glass, chemically strengthened float glass, borosilicate glass, structured glass, tempered glass and thin flexible glass having thickness in the range of for example 20 to 250 μm such as 50 to 100 μm as well as substrates comprising a glass member, such as a partially or fully assembled solar module and an assembly comprising a glass member. The glass member may be SM glass or MM glass. A commercially available MM glass includes Interfloat GMB SINA 3.2 mm solar glass for photovoltaic applications.

In an aspect of the invention the coated substrate is a cover glass for a solar module.

The invention further relates to a solar module comprising a coated substrate as described herein.

Examples of partially or fully assembled solar modules are modules comprising a glass member forming at least a part of the first surface of the substrate and at least one member selected from the group consisting of thin film transparent conductive and/or semiconductor layers, a back sheet, an encapsulant, an electrical conducting film, wiring, a controller box and a frame wherein the glass member being selected from the group of float glass, chemically strengthened float glass, borosilicate glass, structured glass, tempered glass and thin flexible glass having thickness in the range of for example 20 to 250 μm such as 50 to 100 μm. Preferred substrates for the method according to the invention are hence tempered glass, chemically strengthened glass and substrates comprising temperature sensitive components, such as partially or fully assembled solar cell modules. In one embodiment, the substrate comprises a transparent solid sheet member with a base coating on a first side of the sheet member so the base coating forms at least a part of the first surface of the substrate, to be coated with the single non-laminated layer coating layer. Preferably, the base coating is selected from the group of barrier coatings, such as sodium barrier coatings, and anti-reflective coatings.

In an aspect the coated substrate according to the invention comprises a transparent solid sheet member, and a base coating layer interposed between the first surface and the coating layer on the first coating, preferably the base coating is selected from the group of barrier coatings and anti-reflective coatings.

In an aspect the substrate is transparent solid sheet member with a base coating on a first side of the sheet member so the base coating forms at least a part of the first surface of the substrate. In an aspect the substrate is transparent solid sheet member with a base coating on a first side of the sheet member so the base coating forms the first surface of the substrate.

The improved anti-soiling properties may be demonstrated by an increased ARE with $ARE=T_{Coating,0}-T_{Substrate,0}$, where T is the is the average transmittance from 400-1200 nm, Substrate refers to substrate without coating, Coated substrate refers to the substrate with double sided coating and 0 refers to before soil test.

Tcoating,0 and T coated substrate,0 are used interchangeably herein. As a result ARE may also be phrased as: $ARE=T_{Coated\ substrate,0}-T_{Substrate,0}$.

The coating according to the invention is preferably an anti-reflective coating. In an aspect according to the invention the coated substrate demonstrates an ARE of at least 2%, at least 3%, at least 4%, at least 5%.

In an aspect the coated substrate according to the invention demonstrates a substrate-coating anti-reflective effect, ARE, with $$ARE=T_{Coated\ substrate,0}-T_{Substrate,0}$$

of at least 2%, preferably the ARE is at least 3%, more preferably the ARE is at least 4%, where T is the is the average transmittance from 400-1200 nm, Substrate refers to substrate without coating, Coated substrate refers to the substrate with double sided coating and 0 refers to before soil test. In an aspect T is the average transmittance from 400-1200 nm measured by a Shimadzu UV2600 spectrophotometer. In an aspect T is the average transmittance from 400-1200 nm measured by an Optosol Transpec VIS-NIR spectrophotometer.

It is highly preferred that when the coating is arranged on a transparent substrate the coating will have a substrate-coating anti-reflective effect, ARE, $$ARE=T_{Coating,0}-T_{Substrate,0}$$

of at least 2%, preferably the ARE is at least 3%, more preferably the ARE is at least 4%, where T is the is the average transmittance from 400-1200 nm measured by a Shimadzu UV2600 spectrophotometer. Here, "Substrate" refer to substrate without coating, and "Coating" refer to the substrate with double sided coating.

The coating according to the invention is particularly suitable for lowering the reflectivity of a transparent substrate for example any type of glass substrate, hence being used as an anti-reflective coating.

Another aspect of the invention relates to a coating formulation comprising a porogen capable of forming pores with a diameter of 10-120 nm, elongated dense inorganic oxide particles with an aspect ratio of at least 2 and a smaller diameter in the range of 3 to 20 nm, an inorganic binder, a solvent and 0.5 to 30 wt-% aluminium oxide equivalents of aluminium containing compound. Aluminium and aluminum are used interchangeably herein. In an aspect the aluminium oxide equivalents of aluminium containing compound are based on total ash rest after combustion at 600° C., 2 min in air. The aluminium may be provided for example as metal oxide powder, but more preferably as an organic or inorganic salt optionally in solution or suspension. In a preferred embodiment, the coating formulation comprises between 1.0 to 25 wt-% aluminium oxide equivalents of aluminium containing compound as it was found that the stability in the sense of shelf life was best for aluminium concentrations in this range. Stability refers to the stability of the coating formulation. The stability of the coating formulation may be assessed by looking at the homogeneity of the coating formulation. An inhomogeneous coating formulation indicates a low stability and low shelf life. The inhomogeneity of the formulation can be directly observed by the presence of sediments or gellation in the liquid formulation or can be measured by DLS (Dynamic Light Scattering) via the growth or aggregation of colloidal particles in the suspension over time. Using an inhomogeneous coating formulation typically results in a non-homogeneous coating.

In an aspect the coating formulation according to the invention comprises
i. at least 2 wt-% based on oxide equivalents of inorganics of elongated inorganic dense oxide particles with an aspect ratio of at least 2 and an average smaller diameter in the range of 3 to 20 nm as measured by TEM, and
ii. a porogen capable of forming pores with a diameter in the range of 10 to 120 nm,
iii. an inorganic oxide binder, and
iv. a solvent,
wherein the coating formulation comprises between 0.5 to 30 wt-% aluminium oxide equivalents of aluminium containing compound based on total ash rest after combustion at 600° C., 2 min in air, preferably the coating formulation comprises between 1.0 to 25 wt-% aluminium oxide equivalents of aluminium containing compound based on total ash rest after combustion at 600° C.

The porogen may for example be hollow inorganic oxide particles, or core-shell particles having an inorganic oxide (or inorganic oxide precursor) shell and a core comprising an organic compound, such as a cationic polymer or an organic compound with a boiling point below 200° C. The porogen may also be an organic porogen, such as organic nano particle like for example an organic polymeric nano-particle or another porogen, that during conversion of the coating formulation into a functional coating typically will be decomposed, burned, evaporated or otherwise removed. By organic nano particle is herein meant a particle comprising one or more organic molecules and having a size in the range of 50 to 150 nm. Examples of organic molecules are polymers, such as acrylic polymers and latexes; and oligomers. The elongated dense inorganic oxide particle is discussed above.

In an aspect of the invention, the porogen comprises core-shell nanoparticles where the core comprises an organic compound, such as a polymer or an organic compound with a boiling point below 200° C., and the shell comprises an inorganic oxide; and hollow inorganic nanoparticles.

In an aspect of the invention the porogen accounts for 10 to 75 wt-% of the total amount of inorganic oxide equivalents in the coating formulation. In an aspect the porogen accounts for 20 to 50 wt-% of the total amount of inorganic oxide equivalents in the coating formulation.

The inorganic binder typically comprises inorganic oxide particles with a diameter in the range of 0.1 to 7 nm and/or an inorganic oxide precursor with a diameter in the range of 0.1 to 7 nm. The inorganic binder is preferably an inorganic oxide particle or inorganic oxide precursor with a diameter in the order of 0.1 to 7 nm.

It is noted that the inorganic oxide particles may have a diameter of more than 7 nm, e.g. in the range of 7 to 10 nm. It is noted that the inorganic oxide precursor may have a diameter of more than 7 nm, e.g. in the range of 7 to 10 nm.

In an aspect of the invention the inorganic binder comprises inorganic oxide nano particles with an average diameter in the range of 0.1 to 7 nm.

In an aspect the inorganic binder typically comprises inorganic oxide particles with a diameter in the range of 0.1 to 5 nm and/or an inorganic oxide precursor with a diameter in the range of 0.1 to 5 nm.

The diameter of the inorganic oxide particle and/or the inorganic oxide precursor may be measured with Dynamic Light Scattering (DLS). Examples are pre oligomerized silicium alkoxide such as pre oligomerized tetraethoxysilane, pre oligomerized titanium alkoxide and metal oxide sol gels. An example of an inorganic oxide particle and/or the inorganic oxide precursor includes metal oxide sols. Pre oligomerized silicium alkoxide is also referred to by the skilled person as pre oligomerized silicon alkoxide. An inorganic binder may for example be prepared as described in WO 2009/106456 (incorporated herein by reference).

The coating formulation according to the invention comprises a solvent. The solvent can be any solvent, combination of solvents or combination of solvents and additives, such as surfactants and stabilizers, that can realize a stable dispersion of the coating formulation. Typically, the solvent accounts for 80-98% of the mass of the coating formulation. Highly suitable solvents are isopropanol (IPA), water or combinations of solvents including IPA and/or water.

The coating formulations according to the invention comprises elongated dense inorganic oxide particles with an aspect ratio of at least 2, and a smaller diameter in the range of 3 to 20 nm in a coating on a substrate for improving anti-soiling properties of a substrate. It was highly unexpected that the shape of the dense inorganic oxide particles appeared to have a major influence on the anti-soiling properties of the coating and that it hence was possible to reduce the sensitivity to soiling of a substrate by coating it with a coating where elongated dense inorganic oxide particles were included. A coating prepared from a coating formulation comprising non-spherical particles such as elongated particles, in particular elongated dense inorganic oxide particles, demonstrates improved anti-soiling properties as compared to a coating prepared from a coating formulation without elongated dense inorganic oxide particles. In an aspect a coating prepared from a coating formulation comprising non-spherical particles such as elongated particles, in particular elongated dense inorganic oxide particles, demonstrates improved anti-soiling properties as compared to a coating prepared from a coating formulation comprising spherical particles. In other words, this method of reducing sensitivity to soiling of a substrate includes the steps of applying a coating formulation containing elongated dense inorganic oxide particles to a substrate, and convert the coating formulation into a functional coating for example by heating.

Another aspect of the invention concerns a solar module comprising a coated substrate according to the first aspect of this invention. Another aspect of the invention concerns a solar module comprising a coated substrate as described herein. Such solar module exhibits significantly better performance over time at lower operational costs. The reason for that being the reduced frequency of cleaning or the improved power output at the same frequency of cleaning, all of which become possible due to the enhanced anti-soiling properties of the coating of the invention that significantly reduces the soiling of said solar module. Other advantageous devices comprising the coated substrate according to the invention are greenhouse glass (or polymer membrane), concentrated solar modules, windows, displays. In some applications, such as for example roof top coating or container surfaces, the substrate may be non-transparent and the advantage of the invention is there focused on the ability of the anti-soiling coating to reduce collection of dirt on the substrate or to enhance cleanability of the coated substrate as compared to the uncoated substrate.

The coating formulation may be applied to a substrate by any known technique in the art, for example dipping, brushing, spraying, spinning, slot die coating, aerosol coating or via the use of a roller. Spraying can be airless or with the use of conventional air, or electrostatic, or high volume/low pressure (HVLP) or aerosol coating. It is preferred that the coating formulation is applied by roll coating, aerosol coating or dip coating.

By functional coating is meant a coating that enhances mechanical, optical and/or electrical properties of the substrate to which the functional coating is attached. Examples of possible enhanced mechanical properties of a substrate coated with the coating of the invention are increased surface hardness, increased stiffness or wear properties as compared to the mechanical properties of the uncoated substrate. Examples of possible enhanced optical properties of a substrate coated with the coating of the invention are increased light transmittance from air through the functional coating and substrate compared to light transmittance directly from air through the substrate, and reduced reflectance from the interphase from air to the functional coating and the functional coating to the substrate compared to the reflectance directly from air to uncoated substrate. Examples of possible enhanced electrical properties of a substrate coated with the coating of the invention are increased conductivity as compared to the unconverted coating and/or to the uncoated substrate.

Another aspect of the invention concerns the use of a coating formulation comprising elongated inorganic oxide particles with an aspect ratio of at least 2 and a smaller diameter in the range of 3 to 20 nm for improving anti-soiling properties of a substrate. Particularly, this embodiment concerns a coating formulation comprising core-shell nanoparticle as porogen where the core comprises an organic compound, such as a cationic polymer or an organic compound with a boiling point below 200° C., and the shell comprises an inorganic oxide, and between 0.5 to 20 wt-% aluminium oxide equivalents of aluminium containing compound based on total ash rest after combustion at 600° C., 2 min in air. Another aspect of the invention includes the use of a coating formulation as described herein for improving anti-soiling properties of a substrate, such as a cover glass for a solar module.

Another aspect of the invention includes the use of a coating formulation comprising elongated dense inorganic oxide particles with an aspect ratio of at least 2 and a smaller diameter in the range of 3 to 20 nm for improving anti-soiling properties of a substrate, wherein the coating formulation comprises core-shell nanoparticles as porogen, wherein the core comprises an organic compound, such as a polymer or an organic compound with a boiling point below 200° C., the shell comprises a inorganic oxide; and the formulation comprises between 0.1 to 30 wt-% aluminium oxide equivalents of aluminium containing compound.

Another aspect of the invention includes the use of the combination of
- elongated dense inorganic oxide particles having an aspect ratio of at least 2 and a smaller diameter in the range of 3 to 20 nm; and
- an aluminium containing compound, to improve anti-soiling properties of a substrate.

Another aspect of the invention includes the use of elongated dense inorganic oxide particles with an aspect ratio of at least 2, and a smaller diameter in the range of 3 to 20 nm to reduce the soiling of a solar module.

Another aspect of the invention includes the use of the combination of
- elongated dense inorganic oxide particles having an aspect ratio of at least 2 and a smaller diameter in the range of 3 to 20 nm; and
- an aluminium containing compound, to reduce the soiling of a solar module.

Embodiments of the invention include the following:

Embodiment 1

A coating formulation comprising
i. at least 2 wt-% based on oxide equivalents of inorganics of elongated inorganic dense oxide particles with an aspect ratio of at least 2 and an average smaller diameter in the range of 3 to 20 nm as measured by TEM, and
ii. a porogen capable of forming pores with a diameter in the range of 10 to 120 nm,
iii. an inorganic oxide binder, and
iv. a solvent,
wherein the coating formulation comprises between 0.5 to 30 wt-% aluminium oxide equivalents of aluminium containing compound based on total ash rest after combustion at 600° C., 2 min in air, preferably the coating formulation comprises between 1.0 to 25 wt-% aluminium oxide equivalents of aluminium containing compound based on total ash rest after combustion at 600° C.

Embodiment 2

Coating formulation according to embodiment 1, wherein the porogen comprises core-shell nanoparticle where the core comprises an organic compound, such as a cationic polymer or an organic compound with a boiling point below 200° C., and the shell comprises an inorganic oxide; and hollow inorganic nanoparticles.

Embodiment 3

Coating formulation according to embodiment 1 or 2, wherein the porogen account for 10 to 75 wt-% of the total amount of inorganic oxide in the coating formulation, preferably the porogen accounts for 20 to 50 wt-% of the total amount of inorganic oxide in the coating formulation.

Embodiment 4

Coating formulation according to any one of the embodiments 1 to 3, wherein the inorganic binder comprises inorganic oxide nano particles with a number average diameter in the range of 0.1 to 7 nm.

Embodiment 5

Coating formulation according to any one of the embodiments 1 to 4, wherein the elongated dense inorganic oxide particles account for 5 to 70 wt-% of the total amount of inorganic oxide in the coating formulation, preferably for 5 to 50 wt-% of the total amount of inorganic oxide in the coating formulation, more preferably for 10 to 45 wt-% of the total amount of inorganic oxide in the coating formulation, and most preferably for 12 to 30 wt-% of the total amount of inorganic oxide in the coating formulation.

Embodiment 6

A method of preparing a coated substrate comprising the steps of
providing a substrate;
providing a coating formulation according to any one of the embodiments 1 to 5;
applying the coating formulation on the substrate;
drying the coating formulation on the substrate; and
converting the coating formulation on the substrate into a coated substrate.

Embodiment 7

A coated substrate obtainable by the method of embodiment 6.

Embodiment 8

The coated substrate according to embodiment 7, wherein the substrate comprises a transparent solid sheet member with a base coating on a first side of the sheet member so the base coating forms at least a part of the first surface of the substrate, preferably the base coating is selected from the group of barrier coatings and anti-reflective coatings.

Embodiment 9

The coated substrate according to embodiment 7 or 8, wherein a substrate-coating anti-soiling ratio, ASR $$ASR = \frac{(T_{Substrate,0} - T_{Substrate,soil}) - (T_{Coating,0} - T_{Coating,soil})}{(T_{Substrate,0} - T_{Substrate,soil})}$$

is at least 50%, preferably the substrate-coating ASR is at least 75%, more preferably the substrate-coating ASR is at least 80%, and most preferably the substrate-coating ASR is at least 90%, where T is the is the average transmittance from 400-1200 nm measured by a Shimadzu UV2600 spectrophotometer, Substrate refer to substrate without coating, Coating refer to the substrate with double sided coating, 0 refer to before soil test.

Embodiment 10

The coated substrate according to any one of the embodiments 7 to 9, wherein the coated substrate has a substrate-coating anti-reflective effect, ARE, $$ARE = T_{Coated\ substrate,0} - T_{Substrate,0}$$

of at least 2%, preferably the ARE is at least 3%, more preferably the ARE is at least 4%, where T is the is the average transmittance from 400-1200 nm measured by a Shimadzu UV2600 spectrophotometer, Substrate refer to substrate without coating, Coated substrate refer to the substrate with double sided coating.

Embodiment 11

The coated substrate according to any one of the embodiments 7 to 10, wherein the coated substrate has an Antisoiling gain, ASG, $$ASG = 1 - \frac{(T_{coated\ substrate\ with\ Al,0} - T_{coated\ substrate\ with\ Al,soil})}{(T_{coated\ substrate\ without\ Al,0} - T_{coated\ substrate\ without\ Al,soil})}$$

of at least 50%, preferably the ASG is at least 75%, where T is the is the average transmittance from 400-1200 nm measured by a Shimadzu UV2600 spectrophotometer, Coated Substrate with Al refer to a double side coated substrate with the coating with alumina and elongated particles and Coated Substrate without Al refer to a double side coated substrate with same coating except the alumina and dense inorganic oxide particles are excluded, 0 refer to before soil test and soil refer to after soil test.

Embodiment 12

A solar module comprising a coated substrate according to any one of embodiments 7 to 11.

Embodiment 13

Coated substrate according to embodiment 7 to 11, wherein the mass ratio of inorganic oxide originating from the elongated dense inorganic oxide particles to total inorganic oxide of the coating is higher in the 20 nm of the coating closest to the outer surface of the coated substrate than the average mass ratio of the inorganic oxide originating from dense inorganic oxide particles to total inorganic oxide of the coating, preferably the mass ratio of inorganic oxide originating from the dense inorganic oxide particles to total inorganic oxide of the coating is at least 50% higher in the 20 nm of the coating closest to the outer surface than the average mass ratio of the inorganic oxide originating from dense inorganic oxide particles to total inorganic oxide of the coating,
more preferably the mass ratio of inorganic oxide originating from the dense inorganic oxide particles to total inorganic oxide of the coating is at least twice as high in the 20 nm of the coating closest to the outer surface than the average mass ratio of the inorganic oxide originating from dense inorganic oxide particles to total inorganic oxide of the coating.

Embodiment 14

Use of a coating formulation comprising elongated inorganic oxide particles with an aspect ratio of at least 2 and a smaller diameter in the range of 3 to 20 nm for improving anti-soiling properties of a substrate, where the coating formulation comprising core-shell nanoparticle as porogen where the core comprises an organic compound, such as a cationic polymer or an organic compound with a boiling point below 200° C., and the shell comprises a inorganic oxide core-shell porogen, and between 0.5 to 20 wt-% aluminium oxide equivalents of aluminium containing compound based on total ash rest after combustion at 600° C., 2 min in air.

Embodiment 15

The coated substrate according to any one of the embodiments 7 to 11, wherein the onset dust removal is below 5.5 m/s, preferably the onset dust removal is between 5.5 m/s and 4 m/s.

Embodiment 16

A coating formulation comprising
i. at least 2 wt-% based on inorganic oxide equivalents of elongated dense inorganic oxide particles with an aspect ratio of at least 2 and a smaller diameter in the range of 3 to 20 nm;
ii. a porogen capable of forming pores with a diameter in the range of 10 to 120 nm;
iii. an inorganic oxide binder; and
iv. a solvent, wherein the coating formulation comprises between 0.1 to 30 wt-% aluminium oxide equivalents of aluminium containing compound, preferably the coating formulation comprises between 0.5 to 30 wt-% aluminium oxide equivalents of aluminium containing compound.

Embodiment 17

Coating formulation according to embodiment 16, wherein the porogen comprises
core-shell nanoparticles where the core comprises an organic compound, such as a polymer or an organic compound with a boiling point below 200° C., and the shell comprises an inorganic oxide; and
hollow inorganic nanoparticles.

Embodiment 18

Coating formulation according to embodiment 16 or 17, wherein the porogen accounts for 10 to 75 wt-% of the total amount of inorganic oxide equivalents in the coating formulation, preferably the porogen accounts for 20 to 50 wt-% of the total amount of inorganic oxide equivalents in the coating formulation.

Embodiment 19

Coating formulation according to any one of the embodiment 16 to 18, wherein the inorganic oxide binder comprises inorganic oxide nano particles with an average diameter in the range of 0.1 to 7 nm.

Embodiment 20

Coating formulation according to any one of the embodiment 16 to 19, wherein the elongated dense inorganic oxide particles account for 5 to 70 wt-% of the total amount of inorganic oxide equivalents in the coating formulation, preferably for 5 to 50 wt-% of the total amount of inorganic oxide equivalents in the coating formulation, more preferably for 10 to 45 wt-% of the total amount of inorganic oxide equivalents in the coating formulation, and most preferably for 12 to 30 wt-% of the total amount of inorganic oxide equivalents in the coating formulation.

Embodiment 21

A method of preparing a coated substrate comprising the steps of
providing a substrate having a first surface;
providing a coating formulation according to any one of the embodiment 1 to 5, 16 to 20;
applying the coating formulation on the first surface of the substrate;
drying the applied coating formulation; and
converting the substrate with dried coating formulation into a coated substrate comprising a coating layer on the first surface, for example by heating, such as by heating above 400 degrees Celsius.

Embodiment 22

A coated substrate obtainable by the method of embodiment 21, demonstrating improved anti-soiling properties.

Embodiment 23

A coated substrate comprising:
i. a substrate; and
ii. a porous anti-reflective coating layer arranged on at least a part of the substrate,
wherein the anti-reflective coating comprises
pores with a diameter in the range of 10 to 120 nm, preferably 30 to 100 nm; and
elongated dense inorganic oxide particles with an aspect ratio of at least 2, and a smaller diameter in the range of 3 to 20 nm; and
between 0.1 to 30 wt-% aluminium oxide equivalents of aluminium containing compound, preferably 0.5 to 25 wt-% aluminium oxide equivalents of aluminium containing compound.

Embodiment 24

The coated substrate according to any one of embodiments 22 or 23, wherein the substrate comprises a transparent solid sheet member, and a base coating layer interposed between the first surface and the coating layer on the first surface, preferably the base coating is selected from the group of barrier coatings and anti-reflective coatings.

Embodiment 25

The coated substrate according to any one of embodiments 22 to 24, wherein a substrate-coating anti-soiling ratio, ASR, with $$ASR = \frac{(T_{Substrate,0} - T_{Substrate,soil}) - (T_{Coating,0} - T_{Coating,soil})}{(T_{Substrate,0} - T_{Substrate,soil})} \times 100\%$$

is at least 50%, preferably the substrate-coating ASR is at least 75%, more preferably the substrate-coating ASR is at least 80%, and most preferably the substrate-coating ASR is at least 90%, wherein T is the average transmittance from 400-1200 nm, Substrate refers to substrate without coating, Coating refers to the substrate with double sided coating, 0 refers to before soil test and soil refers to after soil test.

Embodiment 26

The coated substrate according to any one of embodiments 22 to 25, wherein the coated substrate has a substrate-coating anti-reflective effect, ARE, with $$ARE = T_{Coated\ substrate,0} - T_{Substrate,0}$$

of at least 2%, preferably the ARE is at least 3%, more preferably the ARE is at least 4%, where T is the average transmittance from 400-1200 nm s, Substrate refers to substrate without coating, Coated substrate refers to the substrate with double sided coating and 0 refers to before soil test.

Embodiment 27

The coated substrate according to any one of embodiments 22 to 26, wherein the coated substrate has an Anti-soiling gain, ASG, with $$ASG = \left[1 - \frac{(T_{coated\ substrate\ with\ Al,0} - T_{coated\ substrate\ with\ Al,soil})}{(T_{coated\ substrate\ without\ Al,0} - T_{coated\ substrate\ without\ Al,soil})}\right] \times 100\%$$

of at least 50%, preferably the ASG is at least 75%, where T is the is the average transmittance from 400-1200 nm, Coated Substrate with Al refers to a double side coated substrate with the coating with alumina and elongated particles and Coated Substrate without Al refers to a double side coated substrate with same coating where the alumina and dense inorganic oxide particles are excluded, 0 refers to before soil test and soil refers to after soil test.

Embodiment 28

Coated substrate according to any one of embodiments 22 to 27, wherein the mass ratio of inorganic oxide originating from the elongated dense inorganic oxide particles to total inorganic oxide of the coating is higher in a 20 nm thick top layer of the coating closest to the outer surface of the coated substrate than the average mass ratio of the inorganic oxide originating from dense inorganic oxide particles to total inorganic oxide of the coating,
preferably the mass ratio of inorganic oxide originating from the dense inorganic oxide particles to total inorganic oxide of the coating is at least 50% higher in the top layer of the coating than the average mass ratio of the inorganic oxide originating from elongated dense inorganic oxide particles to total inorganic oxide of the coating, more preferably the mass ratio of inorganic oxide originating from the elongated dense inorganic oxide particles to total inorganic oxide of the coating is at least twice as high in the top layer the coating than the average mass ratio of the inorganic oxide originating from dense inorganic oxide particles to total inorganic oxide of the coating.

Embodiment 29

The coated substrate according to any one of embodiments 22 to 28, wherein the onset dust removal is below 5.5 m/s, preferably the onset dust removal is between 5.5 m/s and 4 m/s.

Embodiment 30

A coated substrate according to any one of embodiments 7-13, 22 to 29, wherein the substrate is a cover glass for a solar module.

Embodiment 31

A solar module comprising a coated substrate according to any one of embodiments 22 to 30.

Embodiment 32

Use of a coating formulation comprising elongated dense inorganic oxide particles with an aspect ratio of at least 2 and a smaller diameter in the range of 3 to 20 nm for improving anti-soiling properties of a substrate, wherein the coating formulation comprises core-shell nanoparticles as porogen, wherein the core comprises an organic compound, such as a polymer or an organic compound with a boiling point below 200° C., the shell comprises a inorganic oxide; and the formulation comprises between 0.1 to 30 wt-%, preferably between 0.5 to 30 wt %, aluminium oxide equivalents of aluminium containing compound.

Embodiment 33

Use of the combination of
elongated dense inorganic oxide particles having an aspect ratio of at least 2 and a smaller diameter in the range of 3 to 20 nm; and
an aluminium containing compound, to improve anti-soiling properties of a substrate.

Embodiment 34

Use of elongated dense inorganic oxide particles with an aspect ratio of at least 2, and a smaller diameter in the range of 3 to 20 nm to reduce the soiling of a solar module.

Embodiment 35

Use of the combination of
elongated dense inorganic oxide particles having an aspect ratio of at least 2 and a smaller diameter in the range of 3 to 20 nm; and
an aluminium containing compound,
to reduce the soiling of a solar module.

Embodiment 36

Use of elongated dense inorganic oxide particles with an aspect ratio of at least 2, and a smaller diameter in the range of 3 to 20 nm to reduce the frequency of cleaning of a solar module.

Embodiment 37

Use of the combination of
elongated dense inorganic oxide particles having an aspect ratio of at least 2 and a smaller diameter in the range of 3 to 20 nm; and
an aluminium containing compound, to reduce the frequency of cleaning of a solar module.

Embodiment 38

A composition comprising elongated dense inorganic oxide particles having an aspect ratio of at least 2 and a smaller diameter in the range of 3 to 20 nm and an aluminium containing compound.

Measurements

Method of Optical Measurement

The optical properties were measure from 400-1200 nm using a Shimadzu UV2600 and the maximum transmittance was established.

Method of Soiling Measurement

Soiling Procedure:

The anti-soiling properties of the coatings were tested with a Taber Oscillating Abrasion Tester (model 6160) using commercially available Arizona test dust from quartz A4 coarse (size varying from 1 to 200 μm) as soiling medium, commercially available from KSL Staubtechnik GMBH. The 100×100 mm glass plate to be tested was first cleaned with deionized water and a soft cloth, rinsed with laboratory grade ethanol and left to dry overnight. The coated sample was then placed in the tray of the Taber Oscillating table so that the top surface of the glass plate is at the same height as the sample holder inside the tray. Next, 20 g of Arizona test dust is gently dispersed over the whole glass plate using a brush. The soiling procedure (300 cycles at a speed of 100 cycles per minute; one cycle was defined as a full revolution of the circular drive disk: one completed back-and-forth movement of the tray) was performed. The test sample was then removed from the tray and gently tapped to remove the excess of sand on its surface. The relative humidity in the testing environment was at 43% RH and the temperature was 19.5° C.

Soiling Evaluation:

The degree of soiling of the coatings was determined by relative loss in transmittance after soiling, measured with Optosol Transpec VIS-NIR. To that end, transmittance spectra were recorded prior and post artificial soiling via the Taber Oscillating Abrasion Tester. Subsequently, the maximum of transmittance over 400-1200 nm spectra was established. Based on the resulting differences between the before and after values of the maximum transmittance over 400-1200 nm recorded in the spectra, conclusions regarding the level of soiling and hence the effectiveness of the anti-soiling coatings could be drawn.

Method for Determining Inorganic Oxide Composition

Cured sample was scraped off substrate with razorblade. The scrapings were rinsed from the substrate with ethanol and collected. One drop of ethanol suspension was transferred to carbon grid and dried, where after the elemental composition was determined by STEM EDX on scrapings arranged on the edge of the carbon grid. At least components Si, O, Al, and Ti were measured and amounts were determined by the software Esprit 1.9.

Method for Determining Size of Pores

Pore size of porogen pores, i.e. pores with a diameter in the range of 10 to 120 nm, is defined as the length of a line indicating the longest distance between walls of the pore on a cross section orthogonal to the surface of the substrate as measured by SEM. For irregular pore, the line indicating the longest distance may go outside pore. As is well known SEM stands for Scanning Electron Microscopy.

For binder pores with a pore size between 1 to 10 nm, ellipsometry is used to measure the pore size, using the method indicated herein. Since the method utilizes sorption of water in the pores, the measured size corresponds to the smallest diameter of the pore.

Method for Determining Size of Particles

The size of the binder particles and the size of the elongated dense inorganic particles are measured using CryoTEM. The average size is the number average size based on ten randomly selected particles.

Ellipsometry

The volume fraction and pore size distribution of binder pores were determined by water sorption under variation of relative partial pressure of water. In a pore size regime ranging from 2 to 50 nm, the saturation pressure (and hence condensation/evaporation of water in the pores) is a function of the smallest dimension of the pore as described by the Kelvin equation. Condensation of water in the pores drastically changes the optical properties of the coating due to the difference in density between water and air, which optical properties were measured by ellipsometry.

Sample preparation depends on substrate type. For float glass, a scotch tape was applied on the backside of the glass to reduce backside reflections. For SM glass, measurement was done using focusing probes to reduce light scattering induced by the sample roughness. No scotch tape was applied at the backside in the case of SM glass. SM glass used was Interfloat GMB SINA 3.2 mm glass.

The ellipsometer used was a Woollam M-2000 UI running CompleteEase (Woollam) version 5.20.

Data Analysis/Method for Modeling

The experimental data were analyzed by fitting to optical models built using CompleteEase. The bare, uncoated substrate was measured first and then fitted using a b-spline model. The coating layer was described by a Cauchy model, using the first two terms of the series development, A and B. For the evaluation of the model, the data measured at 35% rH was used.

EXAMPLES

Example 1: Preparation of Core-Shell Particle Solution

Core-shell particles were prepared by the same method as disclosed in WO2009/030703 using isopropanol instead of ethanol. The solution was further diluted with isopropanol to a concentration of 10.0 wt-% silica equivalents and had a particle size of 135 nm.

Example 2: Preparation of Inorganic Binder

Silica based inorganic binder was prepared from tetraethoxysilane was prepared by the same method as disclosed in WO 2011/157820 and further diluted with isopropanol to achieve a binder solution of about 2 wt-% silica equivalents and a particle size of 3-5 nm.

Titania based inorganic binder was prepared from titanium(IV)propoxide by mixing diluted HCl with ethanol and titanium(IV)propoxide into a transparent liquid. This mixture was added to ethanol and water at room temperature to achieve a transparent binder solution with particle size of about 3-5 nm and a concentration of 1 wt-% of titania equivalents. To overcome limited shelf life issues, the titanium based binder was used in preparing coating formulations within 24 h of preparation of the inorganic binder.

Example 3: Preparation of Stock Solutions

Al-Stock solution was prepared by dissolving $Al(NO_3)_3 \cdot 9H_2O$ (Fluka, Lot SZBG0830V) into a mixture of isopropanol (Sigma Aldrich, Lot K46556366515) and methoxypropanol (Alfa Aesar, Lot Q14CO27) to a solid content of 5%. Thereafter the solution was further diluted with isopropanol to 2 wt-% alumina equivalents.

Stock solution of elongated IPA-ST-UP particles was prepared by diluting IPA-ST-UP (Nissan Chemical, Lot 111002) with isopropanol to a concentration of 2 wt-% of oxide equivalents. This stock solution was used to prepare the samples in Table 1.

Stock solution of elongated Bindzil 15/750LS silica-based particles was prepared by diluting Bindzil particles in a glacial acetic acid/water mixture of pH 1.64 followed by addition of nitric acid to pH 1.95. The mixture is further diluted with isopropanol to a final concentration of 2 wt-% of inorganic oxide. I.e. 2 wt-% of inorganic oxide equivalents. Bindzil 15/750LS silica-based was obtained from Akzo Nobel (Netherlands).

Example 4: Preparation of Coating Formulations

All formulations were made in a 500 ml semi-transparent HDPE bottle with lid. Amounts of each component are indicated in Table 1. Core-shell solution weighted and 2-propanol was added and the bottle shaken. To this mixture, the inorganic binder was added and the bottle shaken. Subsequently the diluted Al-stock solution was added, and finally the stock solution of elongated particles was added.

Example 5: Coating of Samples

Coatings was prepared with coating formulation that were maximum 48 h old. All samples were soiled within 48 h after preparation of the coating. Formulations were filled into a rectangular shaped container, with an inner size of 2.5*11*11 cm. filled with approximately 200 g of coating formulation.

The coating formulations used to make the coated samples used in the soiling test were maximum 48 hours old.

Glass used was 3.2 mm Optiwhite float glass cut into 10*10 cm plates. Plates were washed and dried prior to coating application. Dipping conditions were: 18.5-19.5° C.; relative humidity <20% rH; dipping speed was varied between 2.5-5.5 mm/s as indicated in Table 1. The Optiwhite float glass used was Optiwhite S.

TABLE 1

| Sample | Core-shell solution (g) | Isopropanol (g) | Silica based binder (g) | Elongated particles solution (g) | Titania based binder (g) | Al-stock solution (g) | Dip-speed (mm/s) |
| --- | --- | --- | --- | --- | --- | --- | --- |
| 1 (Comp) | 7.9 | 72.1 | 80.2 | 40.1 | — | 0 | 5.5 |
| 2 | 7.9 | 72.1 | 80.6 | 40.0 | — | 2.2 | 5.5 |
| 3 | 7.9 | 71.7 | 80.1 | 39.9 | — | 4.0 | 5.5 |
| 4 | 7.9 | 72.0 | 80.1 | 40.0 | — | 8.1 | 5.5 |
| 5 | 7.9 | 72.2 | 80.7 | 40.1 | — | 16.0 | 5.5 |
| 6 | 8.1 | 72.0 | 80.1 | 40.3 | — | 31.9 | 5.5 |
| 7 | 7.9 | 71.8 | 80.3 | 40.3 | — | 64.0 | 4.2 |
| 8 (Comp) | 8.0 | 72.1 | 80.1 | 0.0 | — | 0.0 | 5.5 |
| 9 (Comp) | 8.0 | 72.0 | 80.1 | 40.0 | — | 0.5 | 5.5 |
| 10 | 8.0 | 72.0 | 80.1 | 40.0 | — | 1.0 | 5.5 |
| 11 | 8.0 | 72.0 | 80.1 | 40.0 | — | 1.9 | 5.5 |
| 12 | 8.0 | 72.0 | 80.1 | 40.0 | — | 5.6 | 5.5 |
| 13 (Comp) | 65 | 52.4 | 6.7 | — | 15.1 | — | 2.5 |
| 14 (Comp) | 65 | 52.4 | 6.7 | — | 15.1 | 3.4 | 2.5 |
| 15 | 65 | 52.4 | 6.7 | 15 | 15.1 | 3.4 | 2.5 |

Example 6: Conversion of Applied Coating Formulation into a Functional Coating

The coated samples were cured by heating in an oven at 650° C. for 3 minutes. This treatment is similar to the thermal conversion realized during the tempering process typically used for cover glass for PV solar modules.

TABLE 2

| Sample | % $Al_2O_3$ | Observations | Average T % 400-1200 nm | Max T % (λ at Max) | AS loss* (%-points) | ASR | ASG | ARE |
| --- | --- | --- | --- | --- | --- | --- | --- | --- |
| 0 (comp) | | | 91.3 | — | 3.9 | | | 0 |
| 9 (comp) | 0.3 | Non homogeneous coating | 95.7 | 96.2 (674) | 1.4 | 64.1 | 6.7 | 4.4 |
| 10 | 0.6 | Some defects but AR coating | 96.2 | 97.4 (657) | 0.5 | 87.2 | 66.7 | 4.9 |
| 11 | 1.2 | Normal coating | 96.8 | 98.5 (609) | 0.1 | 97.4 | 93.3 | 5.5 |
| 2 | 1.4 | Normal coating | 96.8 | 98.7 (595) | 0.2 (0.15) | 94.9 | 86.7 | 5.5 |
| 3 | 2.4 | Normal coating | 96.9 | 98.7 (621) | 0.2 (0.15) | 94.9 | 86.7 | 5.6 |
| 12 | 3.6 | Normal coating | 96.7 | 98.7 (584) | 0.01 | 99.7 | 99.3 | 7.4 |

TABLE 2-continued

| Sample | % Al$_2$O$_3$ | Observations | Average T % 400-1200 nm | Max T % (λ at Max) | AS loss* (%-points) | ASR | ASG | ARE |
|---|---|---|---|---|---|---|---|---|
| 4 | 4.8 | Normal coating | 96.4 | 98.1 (617) | 0.3 | 92.3 | 80.0 | 6.8 |
| 5 | 9.1 | Normal coating | 96.6 | 98.2 (688) | 0.3 (0.4) | 92.3 | 80.0 | 6.9 |
| 6 | 16.6 | | 96.1 | 97.6 (666) | 0.2 | 94.9 | 86.7 | 6.3 |
| 7 | 28.6 | Extended edge-effect | 94.8 | 96.2 (903) | 0.2 (0.5) | 94.9 | 86.7 | 4.9 |
| 14 (comp) | 10.8 | Normal coating | 97.2 | 99.3 (607) | 0.4 | 89.7 | 73.3 | |
| 15 | 13.8 | Normal coating | 96.9 | 98.8 (621) | 0.1 | 97.4 | 93.3 | |
| 8 (comp) | 0 | Stable | 97.4 | 99.6 (590) | 1.8 | 53.8 | | 6.1 |
| 1 (comp) | 0 | Non-homogeneous coating | 96.2 | 98.3 (546) | 1.5 | 61.5 | | 4.9 |
| 13 (comp) | 0 | Unstable formulation. Non-homogeneous coating | — | — | — | | | |

Figure 2:
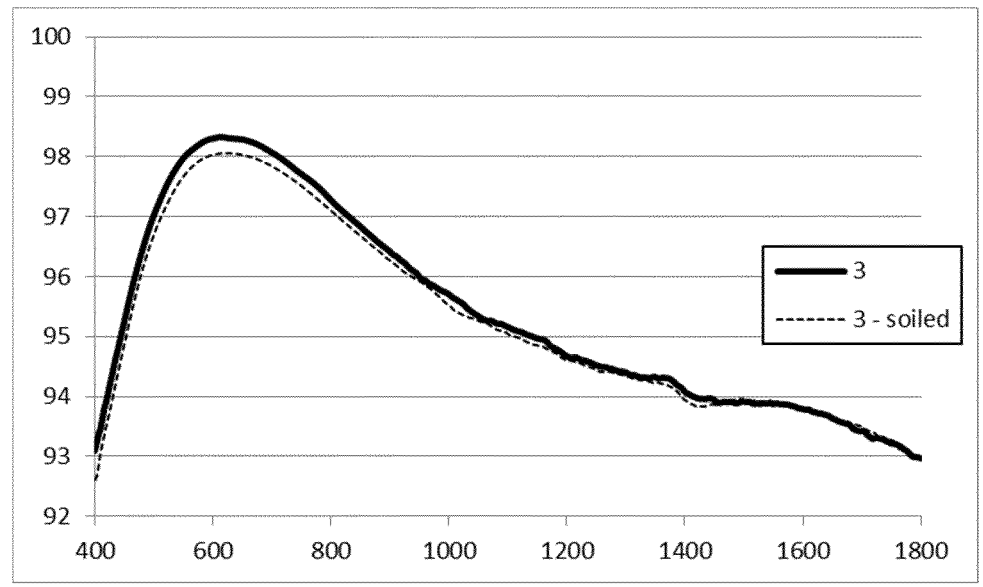
FIG. 2 shows optical properties of a sample according to the invention.

Examples of transmission measurement for a comparative sample (sample 6) before and after soiling is shown in FIG. 1. It is observed that soiling dramatically reduced the transmission. In FIG. 2, the transmission measurement for a sample according to the invention is shown. Here, the transmission before and after soiling are very close.

From Table 2 it is observed that if elongated particles are present, then more than 0.3% wt-% equivalent of Al$_2$O$_3$ were needed to achieve a stable coating formulation with a shelf life of more than a few days. For alumina contents up to about 1.2% equivalent Al$_2$O$_3$, it was observed that increasing the Al$_2$O$_3$ content lead to an increase in optical properties and AS performance (lower loss after soiling test). From 1.2%, the properties seem to reach a plateau. At higher Al$_2$O$_3$ loading, from 9.1% to 43.7%, a decrease in optical performance was observed. In general, the observations are summarized in Table 3.

TABLE 3

| Components | Anti-reflective behaviour | Anti soiling behaviour | Remarks |
|---|---|---|---|
| Core shell particles and inorganic binder | Yes | No | |
| Core shell particles, inorganic binder and elongated particles | No | No | No stable coating could be prepared* |
| Core shell particles, inorganic binder, elongated particles and alumina | Yes | Yes | |
| Core shell particles, inorganic titania based binder and elongated particles | No | No | |
| Core shell particles, inorganic titania based and silica based binder and alumina | Yes | So-so | |
| Core shell particles, inorganic titania based and silica based binder, elontaged particles and alumina | Yes | Yes | |

*The coating formulation was not stable.

It is observed that a stable coating formulation leading to an even coating was achieved for a coating formulation containing core-shell particles and inorganic binder, whereas the same coating formulation became unstable leading to un-even coatings and sedimentation in the coating formulation starting within days when elongated particles was added. When this formulation further contained aluminum species, the resulting coating formulation was stable and the achieved coating showed both anti-reflection and anti-soiling behavior.

For coating formulations containing inorganic oxide binder based on titanium and silicon species as well as core-shell particles, it was observed that if no elongated particles and no aluminum source was added, the coating formulation was unstable leading to un-even coatings. By adding an aluminum source, a stable formulation leading to a coating with anti-reflective properties was obtained. By further adding elongated particles, also anti soiling properties was achieved.

Example 7: Onset Dust Removal

The windspeed for onset of soiling removal was determined in the closed-return wind tunnel of the Geography Research Group at KU Leuven, Belgium using Belgian Brabrantian loess as test dust. Clean, coated and uncoated 100 mm×100 mm×3 mm Pilkington Optiwhite glass slides were placed horizontal on the floor of the large test section of the wind tunnel, more than 5 m downwind from the entrance of the test section and at 0° tilt angle. 4 g/m$^2$ of dust were applied. Relative humidity is kept between 58 and 62%. Thereafter, the samples were moved to a section where wind speed could be increased progressively from 0 m/s to 8.6 m/s. For each step of wind speed, the quantity of remaining dust was measured by a high-precision balance and the onset dust removal was determined. In FIG. 3, a plot of the results is shown. It is observed that for sample z according to the invention, onset dust removal is at a surprisingly much lower wind speed as compared to an uncoated sample (sample z, corresponding to sample XX in Table 1) and the commercially available anti-reflective coating T2 of DSM. In Table 4, the results are summarized.

TABLE 4

| Sample | Onset dust removal (m/s) |
| --- | --- |
| Uncoated sample | 6.7 |
| Sample coated with T2 | 6.1 |
| Sample coated with XX | 5.1 |

**XX indicates Sample 5 (see table 1)

The Optiwhite float glass used was Optiwhite S.
Method of Optical Measurement Used in Example 8 (Below)
The transmittance was measured from 400-1200 nm using an Optosol Transpec VIS-NIR. The average transmittance and Max T % (λ at Max) were determined. The results are listed below.
Method of Soiling Measurement (Soil Test) Example 8
Soiling Procedure:
The anti-soiling properties of the coatings were tested with a Taber Oscillating Abrasion Tester (model 6160) using commercially available Arizona test dust from quartz A4 coarse (size varying from 1 to 200 μm) as soiling medium, commercially available from KSL Staubtechnik GMBH. The 100×100 mm glass plate to be tested was first cleaned with deionized water and a soft cloth, rinsed with laboratory grade ethanol and left to dry overnight. The coated sample was then placed in the tray of the Taber Oscillating table so that the top surface of the glass plate is at the same height as the sample holder inside the tray. Next, 20 g of Arizona test dust was gently dispersed over the whole glass plate using a brush. The soiling procedure (300 cycles at a speed of 100 cycles per minute; one cycle was defined as a full revolution of the circular drive disk: one completed back-and-forth movement of the tray) was performed. The test sample was then removed from the tray and gently tapped to remove the excess of sand on its surface. The back side of the tested glass plate was gently wiped with a soft cloth to remove any dust adhering under the plate. The relative humidity in the testing environment was at 43% RH and the temperature was 19.5° C.

Soiling Evaluation:
The degree of soiling of the coatings was determined by relative loss in transmittance after soiling, measured with an Optosol Transpec VIS-NIR spectrophotometer. To that end, transmittance spectra were recorded prior and post artificial soiling via the Taber Oscillating Abrasion Tester. Subsequently, the average of transmittance over 400-1200 nm was established from the spectra. Based on the resulting differences between the before and after values of the average transmittance over 400-1200 nm recorded in the spectra, conclusions regarding the level of soiling and hence the effectiveness of the anti-soiling coatings could be drawn.

Example 8: Conversion of Applied Coating Formulation into a Functional Coating

The coated samples listed in table 1 were dried at least 15 minute at room temperature and thereafter cured by heating in an oven at 650° C. for 3 minutes.
This treatment is similar to the thermal conversion realized during the tempering process typically used for cover glass for PV solar modules. The results of the optical measurements are listed in Table 5.

TABLE 5

| Sample | % Al$_2$O$_3$ | Observations | Average T % before soil 400-1200 nm | Max T % before soil (λ at Max) | Average T % after soil 400-1200 nm | Max T % after soil 400-1200 nm | AS loss* (%-points) | ASR using average T % | ASG using average T % | ARE using average T % |
| --- | --- | --- | --- | --- | --- | --- | --- | --- | --- | --- |
| 0 (comp) | | | 91.3 | — | 87.4 | — | 3.9 | | | 0 |
| 9 | 0.3 | Non homogeneous coating | 95.7 | 96.2 (674) | 94.3 | 94.7 | 1.4 | 64.1 | 22.2 | 4.4 |
| 10 | 0.6 | Some defects but AR coating | 96.2 | 97.4 (657) | 95.7 | 96.8 | 0.5 | 87.2 | 72.2 | 4.9 |
| 11 | 1.2 | Normal coating | 96.8 | 98.5 (609) | 96.7 | 98.3 | 0.1 | 97.4 | 94.4 | 5.5 |
| 2 | 1.4 | Normal coating | 96.8 | 98.7 (595) | 96.6 | 98.5 | 0.2 | 94.9 | 88.9 | 5.5 |
| 3 | 2.4 | Normal coating | 96.9 | 98.7 (621) | 96.7 | 98.5 | 0.2 | 94.9 | 88.9 | 5.6 |
| 12 | 3.6 | Normal coating | 96.7 | 98.7 (584) | 96.69 | 98.6 | 0.01 | 99.7 | 99.4 | 7.4 |
| 4 | 4.8 | Normal coating | 96.4 | 98.1 (617) | 96.1 | 97.7 | 0.3 | 92.3 | 83.3 | 6.8 |
| 5 | 9.1 | Normal coating | 96.6 | 98.2 (688) | 96.3 | 97.8 | 0.3 | 92.3 | 83.3 | 6.9 |
| 6 | 16.6 | | 96.1 | 97.6 (666) | 95.9 | 97.3 | 0.2 | 94.9 | 88.9 | 6.3 |
| 7 | 28.6 | Extended edge-effect | 94.8 | 96.2 (903) | 94.6 | 95.8 | 0.2 | 94.9 | 88.9 | 4.9 |
| 14 | 10.8 | Normal coating | 97.2 | 99.3 (607) | 96.8 | 98.7 | 0.4 | 89.7 | 77.8 | |
| 15 | 13.8 | Normal coating | 96.9 | 98.8 (621) | 96.8 | 98.7 | 0.1 | 97.4 | 94.4 | |
| 8 (comp) | 0 | Stable | 97.4 | 99.6 (590) | 95.6 | 97.5 | 1.8 | 53.8 | | 6.1 |

TABLE 5-continued

| Sample | % $Al_2O_3$ | Observations | Average T % before soil 400-1200 nm | Max T % before soil (λ at Max) | Average T % after soil 400-1200 nm | Max T % after soil 400-1200 nm | AS loss* (%-points) | ASR using average T % | ASG using average T % | ARE using average T % |
|---|---|---|---|---|---|---|---|---|---|---|
| 1 (comp) | 0 | Non-homogeneous coating | 96.2 | 98.3 (546) | 94.7 | 96.4 | 1.5 | 61.5 | | 4.9 |
| 13 | 0 | Unstable formulation. Non-homogeneous coating | — | — | | | — | | | |

0 (comp) means uncoated glass
*AS loss is transmission loss after soiling on the same plate, Tprior soil minus Tafter soil based on Average T % 400-1200 nm
(comp): comparitive

Example 9: Preparation of Coating Formulation

Preparation of core-shell particle solution was done as described in example 1 above.

Preparation of inorganic binder was done as described in example 2 above.

Preparation of Stock Solutions:

$Al(NO_3)_3$: Al-Stock solution was prepared by dissolving $Al(NO_3)_3 \cdot 9H_2O$ (Fluka, Lot SZBG0830V) into a mixture of isopropanol (Sigma Aldrich, Lot K46556366515) and methoxypropanol (Alfa Aesar, Lot Q140027) to a solid content of 5%. Thereafter the solution was further diluted with isopropanol to 2 wt-% alumina equivalents.

$Al(OiPr)_3$: Al-Stock solution was prepared as follows: demi water was acidified by addition of MSA (70%) in a cold water bath. Then, $Al(OiPr)_3$ (Alfa Aesar, Lot Y09D018) was added in portions and left to stir until all the powder was dissolved. The $Al_2O_3$ content is set to 2 wt-% alumina equivalents.

Stock solution of elongated IPA-ST-UP particles was prepared as described above in Example 3.

Preparation of coating formulations was done as described above in Example 4. Amounts of each component are indicated in Table 6.

Coating of samples (coating glass with coating formulation) was done as described above in Example 5.

For the results in Table 7 the glass used was 3.2 mm Optiwhite S float glass was used. The glass was cut into 10*10 cm plates. Plates were washed and dried prior to coating application. Dipping conditions were: 22.5° C.; relative humidity <30% rH; dipping speed was varied between 4.5-6.8 mm/s as indicated in Table 6.

For the results in Table 8 Interfloat MM glass (textured glass) was used. The dipping speed was set such that an optical thickness of about 600 nm was obtained.

Conversion of Applied Coating Formulation into a Functional Coating

The coated samples listed in table 6 were dried at least 15 minute at room temperature and thereafter cured by heating in an oven at 650° C. for 3.5 minutes. This treatment is similar to the thermal conversion realized during the tempering process typically used for cover glass for PV solar modules. The results of the optical measurements are listed in Tables 7 and 8.

Method of optical measurement: same as under "Method of optical measurement used in example 8" (see above).

Method of soiling measurement (soil test): same as under "Method of soiling measurement (soil test) example 8" (see above).

TABLE 6

Composition of coating formulations

| Formulation | Core-shell solution (g) | Isopropanol (g) | Silica based binder (g) | Elongated particles solution (g) | Al-stock solution (Al(NO3)3) (g) | Al-stock solution (Al(iOPr)3) | Dip-speed Float glass (mm/s) |
|---|---|---|---|---|---|---|---|
| 9-0 | — | — | 200 | — | — | — | |
| 9-1 | — | — | 100 | 33.3 | — | — | 6.0 |
| 9-2 | — | — | 100 | 33.3 | 11.6 | — | 5.1 |
| 9-3 | 8.0 | 72.0 | 80.0 | — | — | — | 6.8 |
| 9-4 | 8.0 | 72.0 | 80.0 | — | 10.4 | — | 5.7 |
| 9-5 | 8.0 | 67.2 | 80.0 | 28.3 | — | — | Non-homogeneous coating |
| 9-6 | 8.0 | 67.2 | 80.0 | 28.3 | 9.8 | — | 5.8 |
| 9-7 | 8.0 | 67.2 | 80.0 | 28.3 | — | 9.8 | 4.5 |

TABLE 7

Soiling Results on Float glass

| Formulation used | % Al$_2$O$_3$ | Observations | Average T % 400-1200 nm | Max T % (λ at Max) | Average T % after soil 400-1200 nm | Max T % after soil | AS loss* (%-points) | ASR | ASG | ARE |
|---|---|---|---|---|---|---|---|---|---|---|
| 0 | | Uncoated float glass | 91.3 | — | 87.4 | — | 3.9 | — | — | — |
| 1 (Comp) | 0 | Non-homogeneous coating | 96.2 | 98.3 (546) | 94.7 | 96.4 | 1.5 | 61.5 | — | 4.9 |
| 9-0 | 0 | Normal coating | 93.7 | 95.8 (481) | 89.7 | | 4.0 | −2.6 | −166.7 | 2.4 |
| 9-1 | 0 | Normal coating | 94.5 | 95.9 (573) | 94.4 | 95.8 | 0.1 | 97.4 | 93.3 | 3.2 |
| 9-2 | 8 | Normal coating | 94.1 | 95.3 (573) | 94.0 | 95.2 | 0.1 | 97.4 | 93.3 | 2.8 |
| 9-3 | 0 | Normal coating | 97.3 | 99.4 (599) | 94.0 | 95.9 | 3.3 | 15.4 | −120.0 | 6 |
| 9-4 | 8 | Normal coating | 96.9 | 99.0 (573) | 93.8 | 95.5 | 3.1 | 20.5 | 93.3 | 5.6 |
| 9-6 | 8 | Normal coating | 97.0 | 98.9 (618) | 97.0 | 99.0 | 0 | 100 | 100 | 5.7 |
| 9-7 | 8 | Normal coating | 96.1 | 97.8 (595) | 96.1 | 98.1 | 0 | 100 | 100 | 4.8 |

*AS loss is transmission loss after soiling on the same plate, Tprior soil minus Tafter soil based on Average T % 400-1200 nm
(comp): compantive

TABLE 8

Soiling Results on MM glass:

| Formulation used | % Al$_2$O$_3$ | Observations | Average T % 400-1200 nm | Max T % (λ at Max) | Average T % after soil 400-1200 nm | Max T % after soil (λ at Max) | AS loss* (%-points) | ASR | ASG | ARE |
|---|---|---|---|---|---|---|---|---|---|---|
| 0 | | Uncoated MM glass | 93 | — | 87.3 | — | 5.7 | — | −714.3 | — |
| 9-1 | 0 | Normal coating | 94.7 | 95.8 (593) | 93.8 | 94.8 | 0.9 | 84.2 | −28.6 | 1.7 |
| 9-2 | 8 | Normal coating | 94.1 | 95.1 (573) | 93.2 | 94.1 | 0.9 | 84.2 | −28.6 | 1.1 |
| 9-3 | 0 | Normal coating | 97.2 | 98.7 (609) | 92.0 | 93.1 | 5.2 | 8.8 | −642.9 | 4.2 |
| 9-4 | 8 | Normal coating | 96.8 | 98.5 (599) | 91.5 | 92.8 | 5.3 | 7.0 | −657.1 | 3.8 |
| 9-5 | 0 | Inhomogeneous coating | 96.3 | 97.0 (883) | 95.6 | 96.5 | 0.7 | 87.7 | — | 3.3 |
| 9-6 | 8 | Normal coating | 97.1 | 98.7 (618) | 97.1 | 98.6 | 0 | 100.0 | 100.0 | 4.1 |
| 9-7 | 8 | Normal coating | 96.3 | 98.0 (600) | 96.3 | 98.2 | 0 | 100.0 | 100.0 | 3.3 |

*AS loss is transmission loss after soiling on the same plate, Tprior soil minus Tafter soil based on Average T % 400-1200 nm

The invention claimed is:

1. A coating formulation comprising
   i. at least 2 wt-% based on inorganic oxide equivalents of elongated dense inorganic oxide particles with an aspect ratio of at least 2 and a smaller diameter in the range of 3 to 20 nm, and having a porosity of less than 5 vol. %;
   ii. a porogen capable of forming pores with a diameter in the range of 10 to 120 nm;
   iii. an inorganic oxide binder; and
   iv. a solvent,
   wherein the coating formulation comprises between 0.6 to 28.6 wt-% aluminium oxide equivalents of aluminium containing compound.

2. The coating formulation according to claim 1, wherein the porogen comprises—core-shell nanoparticles where the core comprises an organic compound or a polymer with a boiling point below 200° C., and the shell comprises an inorganic oxide; and—hollow inorganic nanoparticles.

3. The coating formulation according to claim 1, wherein the porogen accounts for 10 to 75 wt-% of the total amount of inorganic oxide equivalents in the coating formulation.

4. The coating formulation according to claim 1, wherein the inorganic oxide binder comprises inorganic oxide nano particles with an average diameter in the range of 0.1 to 7 nm.

5. The coating formulation according to claim 1, wherein the elongated dense inorganic oxide particles account for 5 to 70 wt-% of the total amount of inorganic oxide equivalents in the coating formulation.

6. A method of preparing a coated substrate comprising the steps of providing a substrate having a first surface;

providing a coating formulation according to claim 1;

applying the coating formulation on the first surface of the substrate;

drying the applied coating formulation; and converting the substrate with dried coating formulation into a coated substrate comprising a coating layer on the first surface.

7. A coated substrate comprising a substrate, and a coating comprised of the coating formulation of claim 1 on the substrate.

8. The coated substrate according to claim 7, wherein the substrate comprises a transparent solid sheet member, and a base coating layer interposed between the first surface and the coating layer on the first surface.

9. The coated substrate according to claim 7, wherein a substrate-coating anti-soiling ratio, ASR, with $$ASR = \frac{(T_{Substrate,0} - T_{Substrate,soil}) - (T_{Coating,0} - T_{Coating,soil})}{(T_{Substrate,0} - T_{Substrate,soil})} \times 100\%$$

is at least 50%, wherein T is the average transmittance from 400-1200 nm, Substrate refers to substrate without coating, Coating refers to the substrate with double sided coating, 0 refers to before soil test and soil refers to after soil test.

10. The coated substrate according to claim 7, wherein the coated substrate has a substrate-coating anti-reflective effect, ARE, with $$ARE = T_{Coatedsubstrate,0} - T_{Substrate,0}$$

of at least 2%, where T is the average transmittance from 400-1200 nm, Substrate refers to substrate without coating, Coated substrate refers to the substrate with double sided coating and 0 refers to before soil test.

11. The coated substrate according to claim 7, wherein the coated substrate has an Antisoiling gain, ASG, with $$ASG = \left[1 - \frac{(T_{coated\ substrate\ with\ Al,0} - T_{coated\ substrate\ with\ Al,soil})}{(T_{coated\ substrate\ without\ Al,0} - T_{coated\ substrate\ without\ Al,soil})}\right] \times 100\%$$

of at least 50%, where T is the is the average transmittance from 400-1200 nm, Coated Substrate with Al refers to a double side coated substrate with the coating with alumina and elongated particles and Coated Substrate without Al refers to a double side coated substrate with same coating where the alumina and dense inorganic oxide particles are excluded, 0 refers to before soil test and soil refers to after soil test.

12. The coated substrate according to claim 7, wherein the mass ratio of inorganic oxide originating from the elongated dense inorganic oxide particles to total inorganic oxide of the coating is higher in a 20 nm thick top layer of the coating closest to the outer surface of the coated substrate than the average mass ratio of the inorganic oxide originating from dense inorganic oxide particles to total inorganic oxide of the coating.

13. The coated substrate according to claim 7, wherein the onset dust removal is below 5.5 m/s.

14. A coated substrate according to claim 7, wherein the substrate is a cover glass for a solar module.

15. A solar module comprising a coated substrate according to claim 7.

16. The coating formulation according to claim 1, wherein the coating formulation comprises between 1.2 to 16.6 wt-% aluminium oxide equivalents of aluminium containing compound.

17. The coating formulation according to claim 3, wherein the porogen accounts for 20 to 50 wt-% of the total amount of inorganic oxide equivalents in the coating formulation.

18. The coating formulation according to claim 5, wherein the elongated dense inorganic oxide particles account for 5 to 50 wt-% of the total amount of inorganic oxide equivalents in the coating formulation.

19. The coating formulation according to claim 5, wherein the elongated dense inorganic oxide particles account for 10 to 45 wt-% of the total amount of inorganic oxide equivalents in the coating formulation.

20. The coating formulation according to claim 5, wherein the elongated dense inorganic oxide particles account for 12 to 30 wt-% of the total amount of inorganic oxide equivalents in the coating formulation.

21. The coated substrate according to claim 8, wherein, the base coating is selected from the group of barrier coatings and anti-reflective coatings.

22. The coated substrate according to claim 9, wherein the substrate-coating ASR is at least 90%.

23. The coated substrate according to claim 10, wherein the ARE is at least 4%.

24. The coated substrate according to claim 11, wherein the ASG is at least 75%.

25. The coated substrate according to claim 12, wherein the mass ratio of inorganic oxide originating from the elongated dense inorganic oxide particles to total inorganic oxide of the coating is at least twice as high in the top layer of the coating than the average mass ratio of the inorganic oxide originating from dense inorganic oxide particles to total inorganic oxide of the coating.

26. The coated substrate according to claim 13, where the onset dust removal is between 5.5 m/s and 4 m/s.

* * * * *